(12) United States Patent
Kim et al.

(10) Patent No.: US 7,368,352 B2
(45) Date of Patent: May 6, 2008

(54) SEMICONDUCTOR DEVICES HAVING TRANSISTORS WITH VERTICAL CHANNELS AND METHOD OF FABRICATING THE SAME

(75) Inventors: Bong-soo Kim, Seongnam-si (KR); Jae-man Yoon, Seoul (KR); Seong-goo Kim, Seoul (KR); Hyeoung-won Seo, Yongin-si (KR); Dong-gun Park, Seongnam-si (KR); Kang-yoon Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 113 days.

(21) Appl. No.: 11/479,462

(22) Filed: Jun. 30, 2006

(65) Prior Publication Data

US 2007/0082448 A1 Apr. 12, 2007

(30) Foreign Application Priority Data

Oct. 12, 2005 (KR) ............ 10-2005-0096169

(51) Int. Cl.
*H01L 21/8234* (2006.01)
*H01L 21/8244* (2006.01)
*H01L 21/336* (2006.01)

(52) U.S. Cl. ............ 438/268; 438/238; 438/257; 438/259; 257/296; 257/335; 257/E21.645; 257/E21.646

(58) Field of Classification Search ........... 438/238, 438/268, 257, 259; 257/335, 296, E21.645, 257/E21.646

See application file for complete search history.

(56) References Cited

U.S. PATENT DOCUMENTS

| | | | |
|---|---|---|---|
| 5,796,167 A | 8/1998 | Koga | 257/758 |
| 6,040,596 A * | 3/2000 | Choi et al. | 257/306 |
| 6,074,918 A * | 6/2000 | Lee | 438/283 |
| 6,362,501 B1 * | 3/2002 | Kim | 257/296 |

FOREIGN PATENT DOCUMENTS

| | | |
|---|---|---|
| JP | 10-050952 | 2/1998 |
| KR | 10-2004-0096339 | 11/2004 |
| KR | 10-0437551 | 12/2004 |

* cited by examiner

*Primary Examiner*—Michael Lebentritt
*Assistant Examiner*—Mohsen Ahmadi
(74) *Attorney, Agent, or Firm*—Mills & Onello LLP

(57) ABSTRACT

In a semiconductor device and a method of fabricating the same, a vertical channel transistor has a cell occupation area of $4F^2$. The semiconductor device comprises: a cell array region having a plurality of unit cells, each unit cell having a cell occupation area, repeatedly aligned along a first direction and along a second direction, the first and second directions being perpendicular to each other in a horizontal direction along a primary surface of a semiconductor substrate, wherein each unit cell has a uniform first pitch in the first direction and in the second direction; an active pillar vertically extending from an active region of each unit cell integrally with the semiconductor substrate in a vertical direction that is perpendicular with respect to the primary surface of the semiconductor substrate, wherein widths of at least a portion of the active pillar in the first direction and in the second direction are equal to a first width 1F as a minimum feature size in the cell array region; a ring-shaped gate surrounding a sidewall of the active pillar; a channel region formed to extend along the active pillar in the vertical direction; a buried bit line formed below the active pillar in the semiconductor substrate; and a word line extending in the horizontal direction perpendicular to the buried bit line, and electrically connected to the ring-shaped gate, wherein a distance from the active pillar of any one unit cell of the plurality of unit cells to each of the active pillars of nearest neighboring unit cells in the first direction and the second direction is equal to the first width of the active pillar of one unit cell.

33 Claims, 21 Drawing Sheets

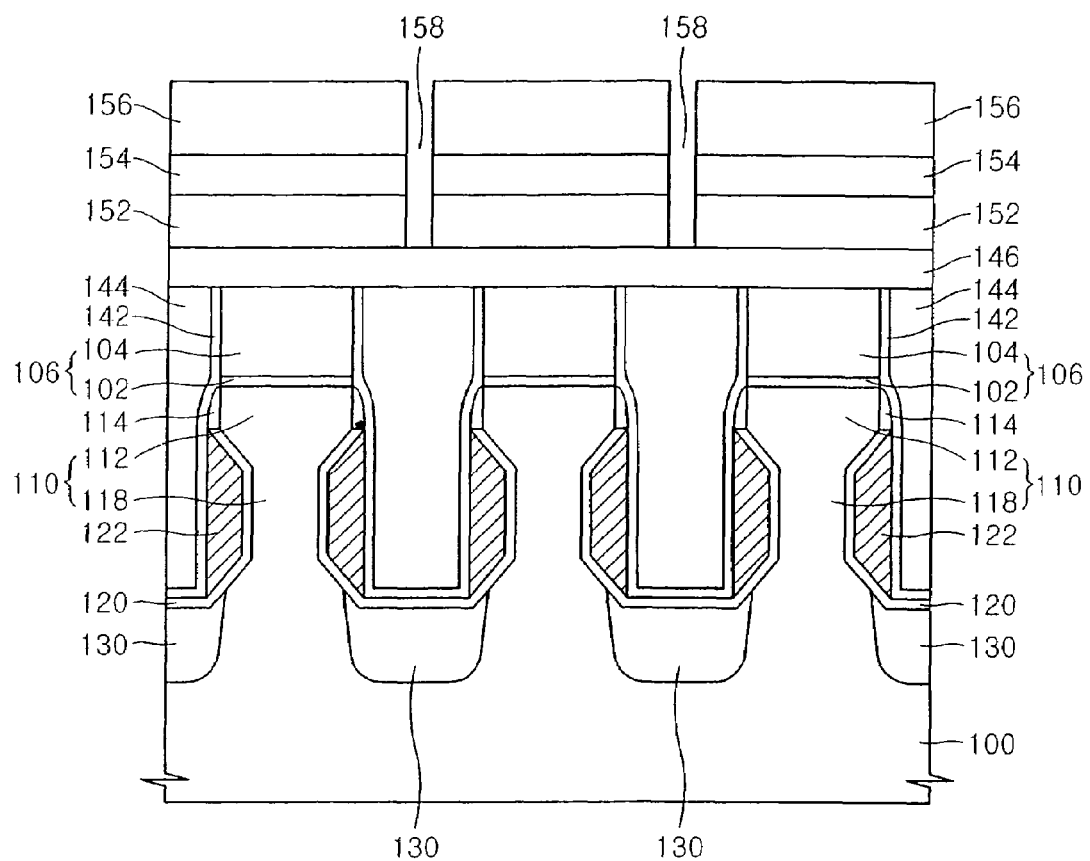

SEMICONDUCTOR DEVICES HAVING TRANSISTORS WITH VERTICAL CHANNELS AND METHOD OF FABRICATING THE SAME

CROSS-REFERENCE TO RELATED PATENT APPLICATION

This application claims priority to Korean Patent Application No. 10-2005-0096169, filed on Oct. 12, 2005, in the Korean Intellectual Property Office, the contents of which are incorporated herein by reference in their entirety.

BACKGROUND OF THE INVENTION

1. Field of the Invention

The present invention relates to a semiconductor device having a vertical channel transistor and a method of fabricating the same, and more particularly, to a semiconductor device having a buried bit line formed below a vertical channel transistor, and a method of fabricating the same.

2. Description of the Related Art

With the continued increase in the integration density of semiconductor memory devices, the planar area occupied by each unit cell becomes further reduced. In order to achieve a reduction of the unit cell area, there have been proposed various methods to form a transistor, a bit line, a word line, and a buried contact for a storage node contact of a capacitor, in a limited area. In one of the methods, a semiconductor device with a vertical channel has been proposed, in which a source and a drain are disposed vertically inside an active-region in a semiconductor memory device such as a dynamic random access memory (DRAM), so as to form a vertical channel.

In a vertical channel MOS transistor, the device channel is formed to be oriented in a vertical direction with respect to the primary surface of a semiconductor substrate by forming a gate electrode about an active pillar that extends in a vertical direction with respect to the primary surface of the semiconductor substrate, and forming source/drain regions respectively on and below the active pillar based on the gate electrode. Thus, in this configuration, even though the horizontal device area occupied by the MOS transistor is reduced, the structure of the MOS transistor can be formed without being influenced by channel length. In order to realize the vertical channel semiconductor device as above, a technology of forming a buried bit line structure has been proposed, in which a bit line is buried in an isolation region of a cell.

In order to form the buried bit line in the vertical channel semiconductor device using the conventional technology, the semiconductor substrate is etched using an etch condition in which the buried bit line is self-aligned with the active pillar and an insulating layer is formed about the resulting structure so as to form the buried bit line. The buried bit line formed as above has a problem in that its width is not uniform in the longitudinal direction of the bit line. As a result, the resistance distribution of the bit line becomes non-uniform along its longitudinal direction. Further, in order to perform the self-alignment etch process method to form a line-shaped bit line extending along a predetermined direction, it is restricted to design a plurality of active pillars such that a distance in the direction of the bit line and a distance in the direction perpendicular to the bit line based on each active pillar are different. As a result, alignment design in the x direction and the y direction relative to an active pillar becomes asymmetrical. As such, when semiconductor devices are fabricated by the asymmetrical alignment design layout, an etch process of, for example, etching a conductive layer to form a cylindrical, ring-shaped, gate electrode formed to surround an outer circumference of the active pillar becomes unstable so that an excessive etch can occur in the relatively wider spaces while reduced etching, or lack of etching, can occur in relatively narrow areas, thereby reducing the process margin of the resulting devices. Further, since the space that can be used to form a contact is limited, the process of forming the contact can be complicated.

SUMMARY OF THE INVENTION

The present invention provides a semiconductor device configured to overcome the asymmetry limitation described above and configured to provide a buried bit line having a uniform resistance distribution along its length and a method of fabricating the same.

In one aspect, the present invention is directed to a semiconductor device comprising: a cell array region having a plurality of unit cells, each unit cell having a cell occupation area, repeatedly aligned along a first direction and along a second direction, the first and second directions being perpendicular to each other in a horizontal direction along a primary surface of a semiconductor substrate, wherein each unit cell has a uniform first pitch in the first direction and in the second direction; an active pillar vertically extending from an active region of each unit cell integrally with the semiconductor substrate in a vertical direction that is perpendicular with respect to the primary surface of the semiconductor substrate, wherein widths of at least a portion of the active pillar in the first direction and in the second direction are equal to a first width 1F as a minimum feature size in the cell array region; a ring-shaped gate surrounding a sidewall of the active pillar; a channel region formed to extend along the active pillar in the vertical direction; a buried bit line formed below the active pillar in the semiconductor substrate; and a word line extending in the horizontal direction perpendicular to the buried bit line, and electrically connected to the ring-shaped gate, wherein a distance from the active pillar of any one unit cell of the plurality of unit cells to each of the active pillars of nearest neighboring unit cells in the first direction and the second direction is equal to the first width of the active pillar of one unit cell.

In one embodiment, each of the plurality of unit cells has a cell occupation area of $4F^2$.

In another embodiment, the bit line extends along either one direction of the first direction and the second direction with a uniform width.

In another embodiment, the active pillar comprises an upper active portion having the first width in the first direction and the second direction, and a lower active portion having a smaller width than the first width in the first direction and the second direction, and the ring-shaped gate is formed to surround a sidewall of the lower active portion of the active pillar.

In another embodiment, the ring-shaped gate comprises an inner circumference surface about a sidewall of the lower active portion of the active pillar, and an outer circumference surface contacting the word line.

In another embodiment, the device further comprises a gate dielectric layer between the ring-shaped gate and the sidewall of the active pillar.

In another aspect, the present invention is directed to a semiconductor device comprising: a cell array region having a plurality of unit cells, each unit cell having a cell occupation area in a semiconductor substrate; an active pillar extending in a vertical direction with respect to the substrate from an active region of each unit cell in the cell array region, the active pillar having a first width portion and a second width portion, the second width portion having a width that is greater than a width of the first width portion; a ring-shaped insulation spacer on the sidewall of the second width portion of the active pillar, the ring-shaped insulation spacer having an inner surface and an outer surface; a gate dielectric layer on a sidewall of the active pillar; a ring-shaped gate on a portion of the gate dielectric layer formed on the sidewall of the active pillar, the ring-shaped gate having an inner surface contacting the gate dielectric layer and an outer surface; a channel region formed to extend in the vertical direction of the active pillar; a first source/drain region formed at a bottom portion of the active pillar; a second source/drain region formed at a top portion of the active pillar; and wherein a width of a widest portion of the outer surface of the ring-shaped gate is equal to or less than that of a widest portion of the outer surface of the ring-shaped insulation spacer.

In one embodiment, the device further comprises a buried bit line formed below the active pillar in the semiconductor substrate and electrically connected to the first source/drain region.

In another embodiment, the device further comprises a word line extending in a horizontal direction and electrically connected to the ring-shaped gate.

In another embodiment, the device further comprises a capacitor electrically connected to the second source/drain region.

In another embodiment, the device further comprises an insulating layer pattern bisecting neighboring first source/drain regions of neighboring unit cells.

In another embodiment, the device further comprises an ion implantation region below the insulating layer pattern.

In another aspect, the present invention is directed to a method of fabricating a semiconductor device comprising: forming a plurality of active pillars on a semiconductor substrate to extend in a vertical direction relative to a horizontal primary surface of the semiconductor substrate, the plurality of active pillars formed integrally with the semiconductor substrate; forming a gate insulating layer covering a surface of the active pillar; forming a ring-shaped gate surrounding a sidewall of the active pillar on the gate insulating layer in a region of the active pillar; implanting ions into a region of the semiconductor substrate adjacent to the ring-shaped gate, thereby forming a bottom source/drain region; covering an outer surface of the ring-shaped gate and the bottom source/drain region with an etch stop layer; etching the etch stop layer, the bottom source/drain region, and the semiconductor substrate therebelow in a region between two neighboring active pillars of the plurality of active pillars using a photolithography process, thereby defining a buried bit line below the active pillar in the semiconductor substrate; and forming a word line electrically connected to the ring-shaped gate in a region between two neighboring active pillars of the plurality of active pillars.

In one embodiment, the forming of the buried bit line comprises: forming a first insulating layer on the bottom source/drain region to completely fill a space between two neighboring active pillars of the plurality of active pillars; sequentially forming a planarized second insulating layer, a carbon-containing layer, a hard mask layer, and a photoresist pattern on the first insulating layer; etching the hard mask layer using the photoresist pattern as an etch mask; etching the carbon-containing layer using the hard mask layer as an etch mask; etching the planarized second insulating layer and the first insulating layer using the carbon-containing layer as an etch mask, thereby exposing the etch stop layer covering the bottom source/drain region; and etching the etch stop layer, the bottom source/drain region, and the semiconductor substrate using the planarized second insulating layer as an etch mask, thereby forming a trench line bisecting neighboring first source/drain regions into two isolated regions and thereby defining the buried bit line below the active pillar in the semiconductor substrate.

In another embodiment, the etch stop layer is formed of a nitride layer, and the first insulating layer is formed of an oxide layer.

In another embodiment, the planarized second insulating layer is formed of an oxide layer.

In another embodiment, the carbon-containing layer is formed of an amorphous carbon layer (ACL).

In another embodiment, the hard mask layer is one selected from an oxide layer, an oxynitride layer, and a combination thereof.

In another embodiment, the method further comprises, after forming the hole defining the buried bit line, performing an ion implantation process into the hole, thereby forming an ion implantation region for isolation in the semiconductor substrate.

In another embodiment, the word line is formed to extend in the direction perpendicular to the buried bit line.

In another embodiment, the forming of the word line comprises: partially exposing an outer surface of the ring-shaped gate in a region between two neighboring active pillars of the plurality of active pillars; and depositing a conductive material on the region, thereby forming the word line contacting a surface of the exposed ring-shaped gate.

In another embodiment, the forming of the word line comprises: filling the inside of the hole with a third insulating layer after forming the hole; removing a portion of the first insulating layer, a portion of the third insulating layer, and a portion of the etch stop layer in the region between two neighboring active pillars, so as to partially expose an outer surface of the ring-shaped gate; and depositing a conductive material on the predetermined region, thereby forming the word line contacting an exposed outer surface of the ring-shaped gate.

In another embodiment, the third insulating layer is formed of an oxide layer.

In another embodiment, the method further comprises: forming a top source/drain region on an end of the active pillar opposite the semiconductor substrate, so as to form a vertical channel region along the longitudinal direction of the active pillar; and forming a contact contacting the top source/drain region on the active pillar.

In another embodiment, the contact is a contact connecting the top source/drain region to a lower electrode of a capacitor.

In another embodiment, the forming of the plurality of active pillars comprises: forming a plurality of mask patterns defining an active pillar region in the semiconductor substrate; and etching the semiconductor substrate using the mask pattern as an etch mask, thereby forming the active pillar, and wherein forming the contact comprises: forming a fourth insulating layer concurrently covering a sidewall of the active pillar and a sidewall of the mask pattern in a state that the mask pattern covers an upper surface of the active pillar; forming a fifth insulating layer having an opening exposing an upper surface of the mask pattern on the fourth insulating layer; removing the mask pattern exposed through the opening of the fifth insulating layer, so as to expose the upper surface of the active pillar; and depositing a conductive material on the upper surface of the active pillar to fill an opening of the fifth insulating layer, thereby forming the contact contacting the upper surface of the active pillar.

In another embodiment, the fourth insulating layer and the fifth insulating layer are respectively formed of oxide layers.

In another aspect, the present invention is directed to a method of fabricating a semiconductor device comprising: providing a cell array region having a plurality of unit cells, each unit cell having a cell occupation area in a semiconductor substrate; forming an active pillar extending in a vertical direction with respect to the substrate from an active region of each unit cell in the cell array region, the active pillar having a first width portion and a second width portion, the second width portion having a width that is greater than a width of the first width portion; forming a ring-shaped insulation spacer on a sidewall of the second width portion of the active pillar, the ring-shaped insulation spacer having an inner surface and an outer surface; forming a gate dielectric layer on a sidewall of the active pillar; forming a ring-shaped gate on a portion of the gate dielectric layer formed on the sidewall of the active pillar, the ring-shaped gate having an inner surface contacting the gate dielectric layer and an outer surface; forming a channel region formed to extend in the vertical direction of the active pillar; forming a first source/drain region formed at a bottom portion of the active pillar; forming a second source/drain region formed at a top portion of the active pillar; wherein a width of a widest portion of the outer surface of the ring-shaped gate is equal to or less than that of a widest portion of the outer surface of the ring-shaped insulation spacer.

In another embodiment, the method further comprises forming a buried bit line below the active pillar in the semiconductor substrate and electrically connected to the first source/drain region.

In another embodiment, the method further comprises forming a word line extending in a horizontal direction and electrically connected to the round-shaped gate.

In another embodiment, the method further comprises forming a capacitor electrically connected to the second source/drain region.

In another embodiment, the method further comprises forming an insulating layer pattern bisecting the first source/drain regions of neighboring unit cells.

In another embodiment, the method further comprises forming an ion implantation region below the insulating layer pattern.

BRIEF DESCRIPTION OF THE DRAWINGS

The above and other features and advantages of the present invention will become more apparent by describing in detail exemplary embodiments thereof with reference to the attached drawings in which:

FIG. 9A and FIG. 9B through FIG. 24A and FIG. 24B are sectional views illustrating a method of fabricating a semiconductor device in accordance with processing sequences according to an embodiment of the present invention, in which FIGS. 9A through 24A are sectional views taken along a line A-A' of FIGS. 1 through 8 respectively, and FIGS. 9B through 24B are sectional views taken along a line B-B' of FIGS. 1 through 8 respectively.

DETAILED DESCRIPTION OF EMBODIMENTS OF THE INVENTION

The present invention will now be described more fully hereinafter with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete. Like numbers refer to like elements throughout the specification.

FIGS. 1 through 8 are schematic planar layouts illustrating a method of fabricating a semiconductor device in accordance with processing sequences according to an embodiment of the present invention. FIGS. 9A through 24A are sectional views taken along a line A-A' of FIGS. 1 through 8 respectively, and FIGS. 9B through 24B are sectional views taken along a line B-B' of FIGS. 1 through 8 respectively.

Figure 1:
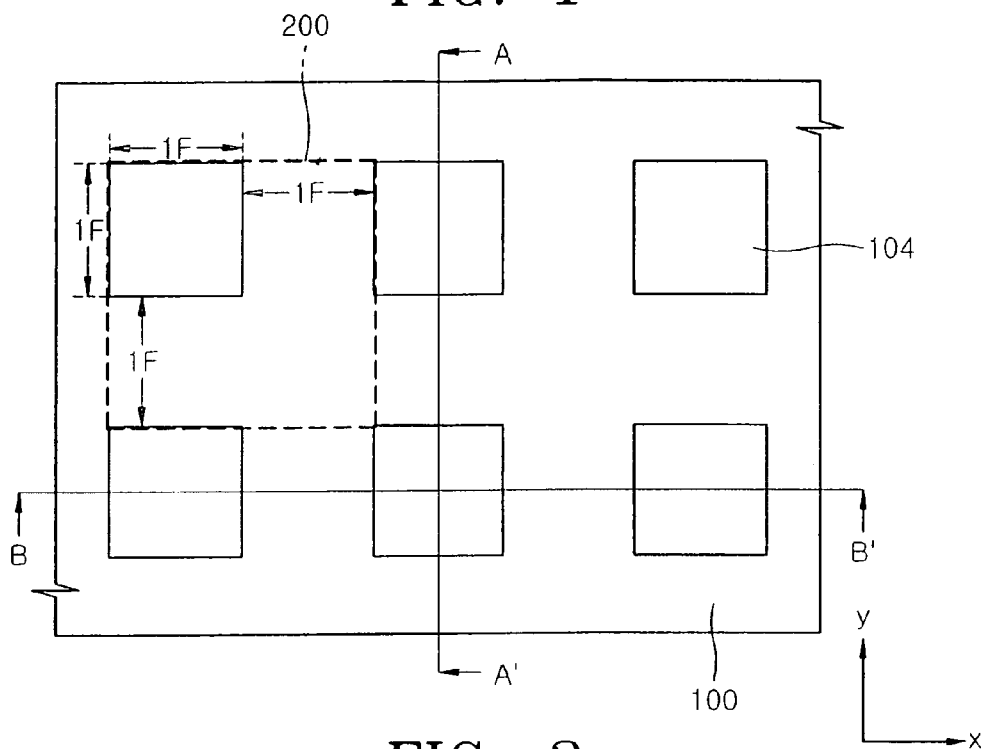
FIGS. 1 through 8 are schematic planar layouts illustrating a method of fabricating a semiconductor device in accordance with processing sequences according to an embodiment of the present invention.
Figure 9A:
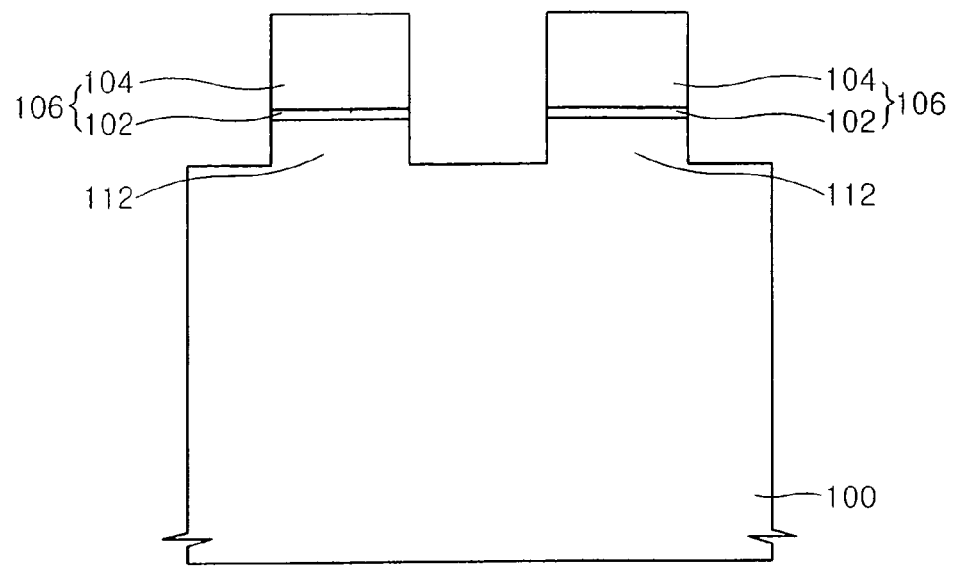
Figure 9B:
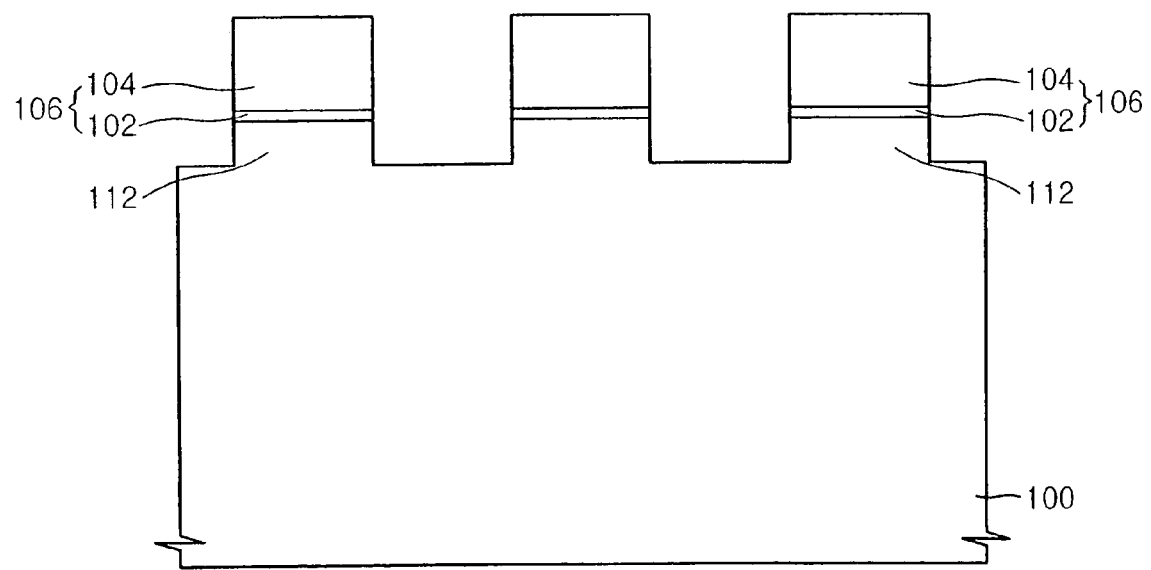

Referring to FIG. 1, FIG. 9A as a sectional view taken along a line A-A' of FIG. 1, and FIG. 9B as a sectional view taken along a line B-B' of FIG. 1, after a pad oxide layer 102 and a hard mask layer 104, for example, a silicon nitride layer, are sequentially formed in a cell array region on a semiconductor substrate 100, they are patterned using a photolithography process, thereby forming a plurality of hard mask patterns 106 covering a portion of each unit cell region in the cell array region.

The pad oxide layer 102, for example, a silicon oxide layer, may be formed by a thermal oxidation method, and may be formed with a thickness of about 50 Å through 150 Å. Widths of the hard mask pattern 106 in the x direction and the y direction are equal to each other, and the width is 1F in length where F represents the minimum feature size of the semiconductor device to be formed. Further, the plurality of hard mask patterns 106 are aligned with spaced from each other by a same distance in the x direction and the y direction, that is, one hard mask pattern 106 is spaced from its neighboring hard mask patterns in the x direction and the y direction respectively by a distance 1F, which is equal to the width of the hard mask pattern 106. A cell area occupied by one unit cell region 200 having one hard mask pattern 106 formed therein is $4F^2$.

The semiconductor substrate 100 is etched to a predetermined depth, using the hard mask pattern 106 as an etch mask, thereby forming an upper pillar 112 that protrudes from an upper surface of the semiconductor substrate 100.

Although the hard mask pattern 106 has a rectangular-shaped layout in a plan view illustrated in FIG. 1, but has a substantially cylindrical shape as a result of the etch process and the like.

Figure 10A:
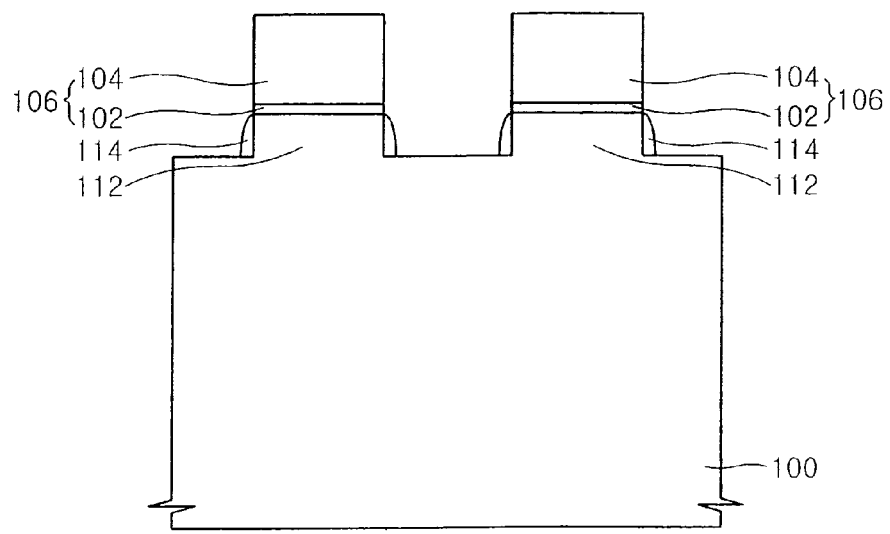
Figure 10B:
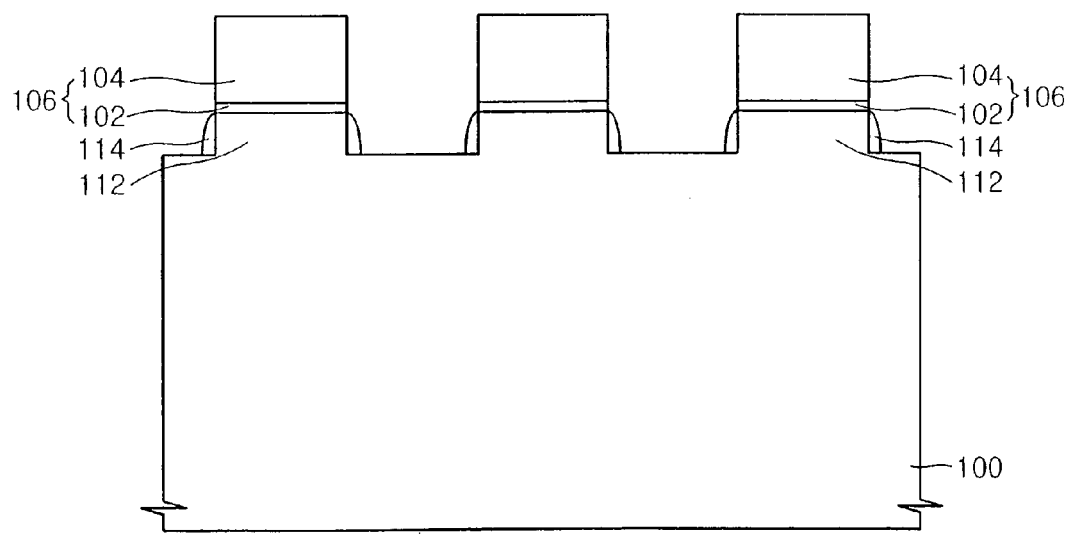

Referring to FIGS. 10A and 10B, a ring-shaped insulation spacer 114 surrounding the sidewall of the upper pillar 112 is formed. An upper surface of the semiconductor substrate 100 around the insulation spacer 114 is partially exposed.

The insulation spacer 114 may be composed of combination of, for example, an oxide layer and a nitride layer. For example, in order to form the insulation spacer 114, after an oxide thin film is formed on the exposed surface of the semiconductor substrate 100 including the outer circumference surface of the upper pillar 112 using a radical oxidation process, a nitride layer is formed to cover the overall resultant structure, and the nitride layer may be treated using an etch-back process.

Figure 11A:
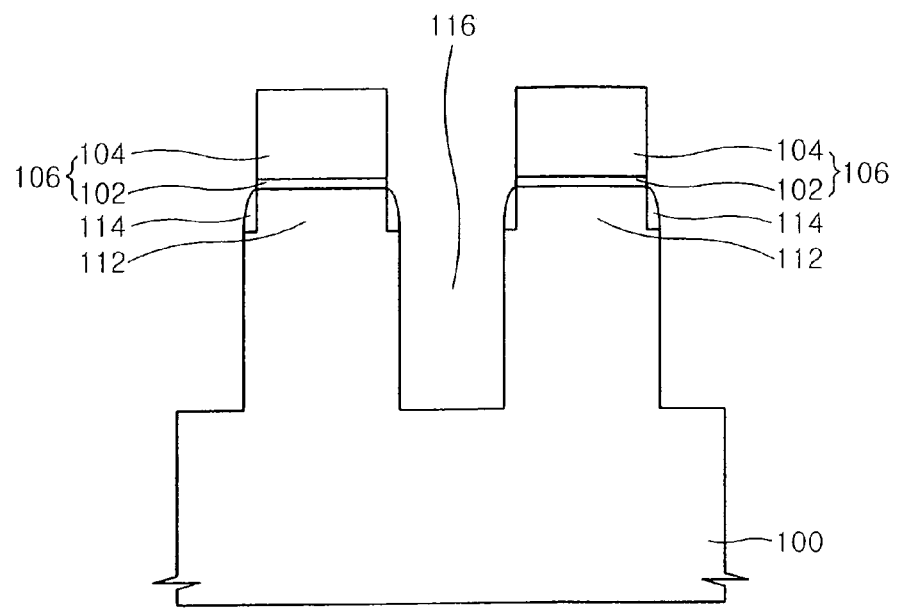
Figure 11B:
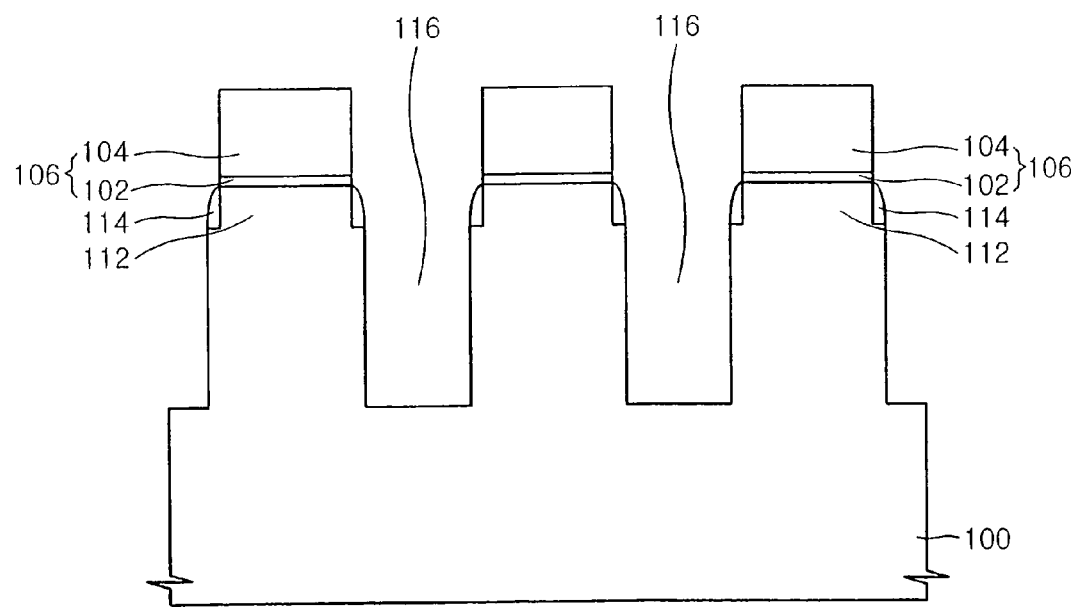

Referring to FIGS. 11A and 11B, the exposed surface of the semiconductor substrate is etched using the hard mask pattern 106 and the insulation spacer 114 as etch masks, thereby forming a trench 116.

Figure 12A:
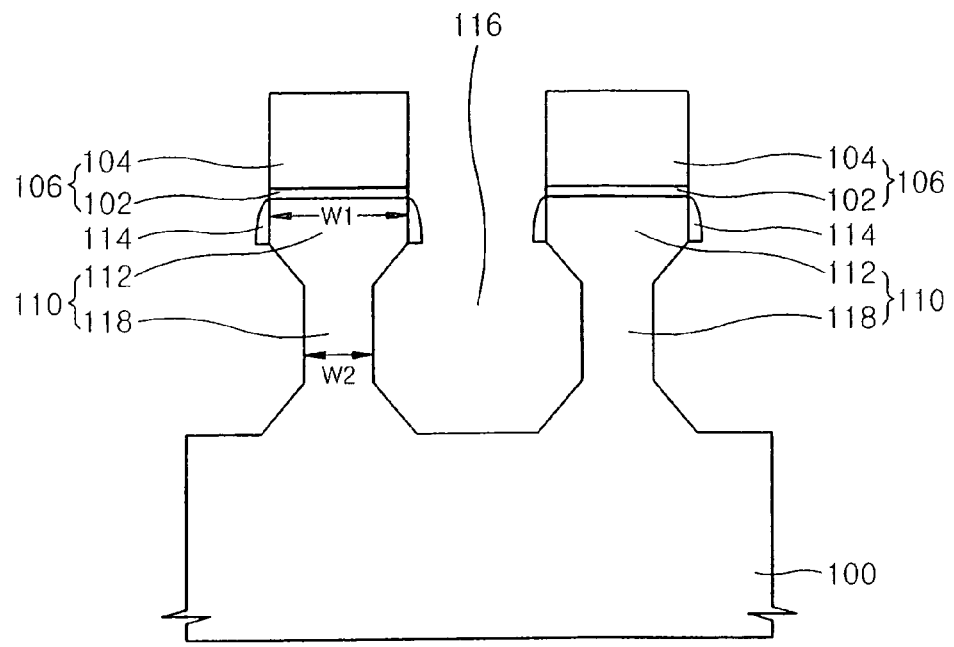
Figure 12B:
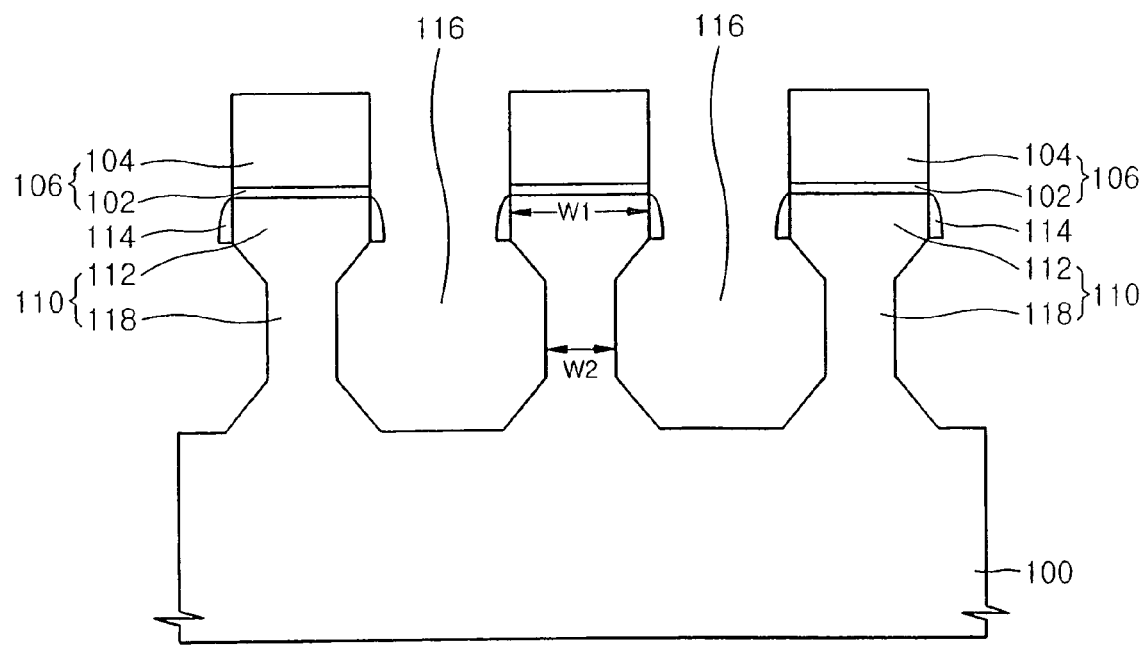

Referring to FIGS. 12A and 12B, the exposed surface of the semiconductor substrate 100 is etched using an isotropic wet etch process, thereby forming a lower pillar 118, which is composed of a portion of the semiconductor substrate 100, and extends integrally with the upper pillar 112 in the vertical direction. The lower pillar 118 has a width $W_2$ smaller than a width $W_1$ of the upper pillar 112. The upper pillar 112 and the lower pillar 118 constitute an active pillar 110 providing a vertical channel region of a transistor.

A plurality of active pillars 110 are respectively disposed in the plurality of unit cells, each having a cell occupying area $4F^2$, repeatedly along the x direction and the y direction on the semiconductor substrate 100, and the active pillars 110 are aligned in the cell array region with a uniform pitch by a same distance in the x direction and the y direction. In the unit cell structure explained in reference to FIG. 1, the active pillar 110 is aligned with a pitch of 2 F in the x direction and in the y direction in this embodiment.

Figure 13A:
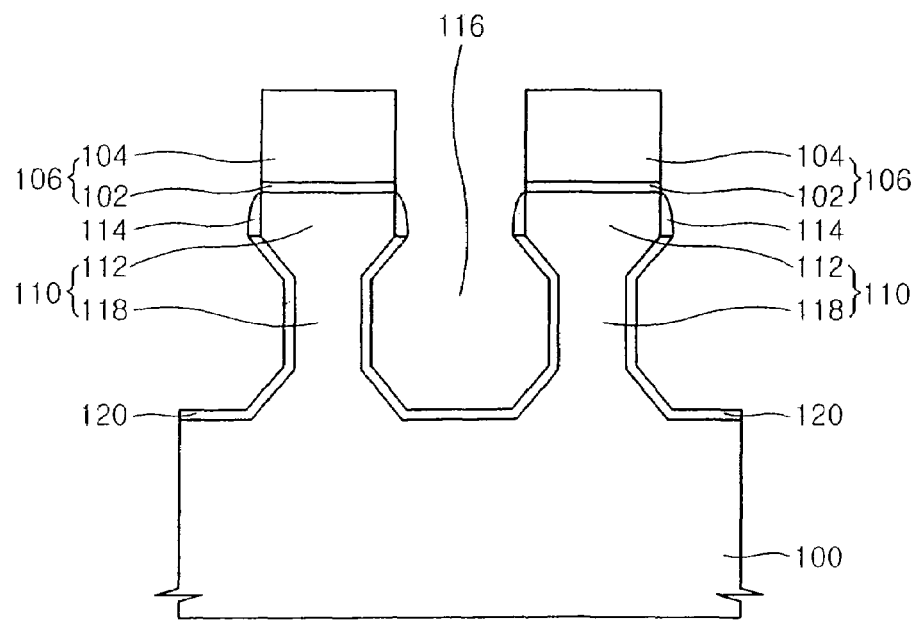
Figure 13B:
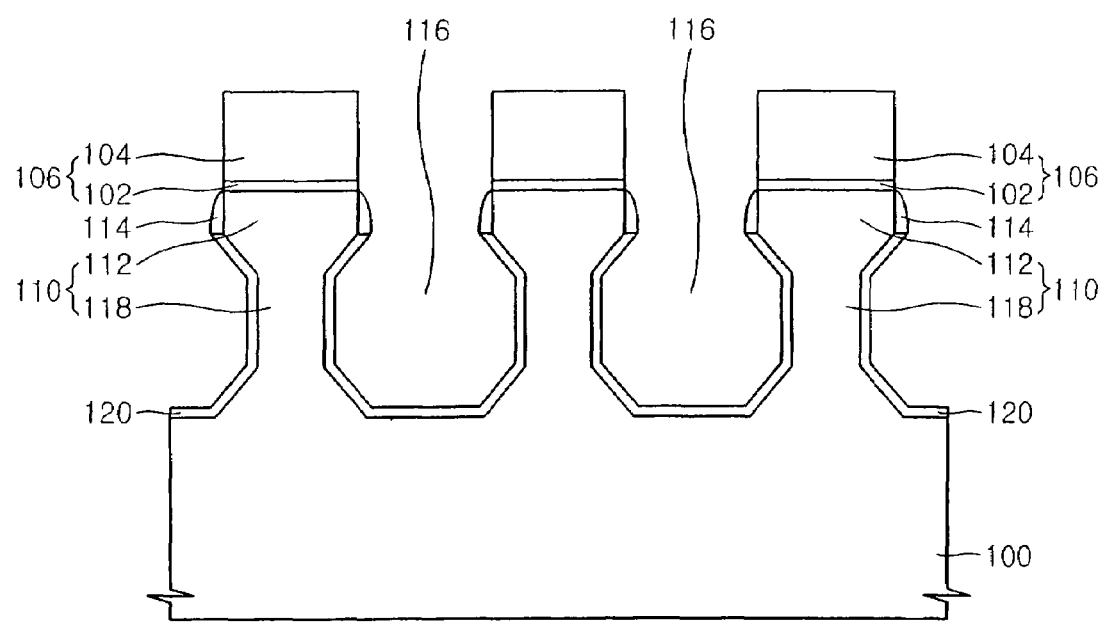

Referring to FIGS. 13A and 13B, a gate insulating layer 120 is formed on the exposed surfaces of the semiconductor substrate 100 that are exposed inside the trench 116 including the outer circumference sidewall of the active pillar 110. The gate insulating layer 120 may be formed of an oxide layer formed by, for example, a radical oxidation process.

Figure 14A:
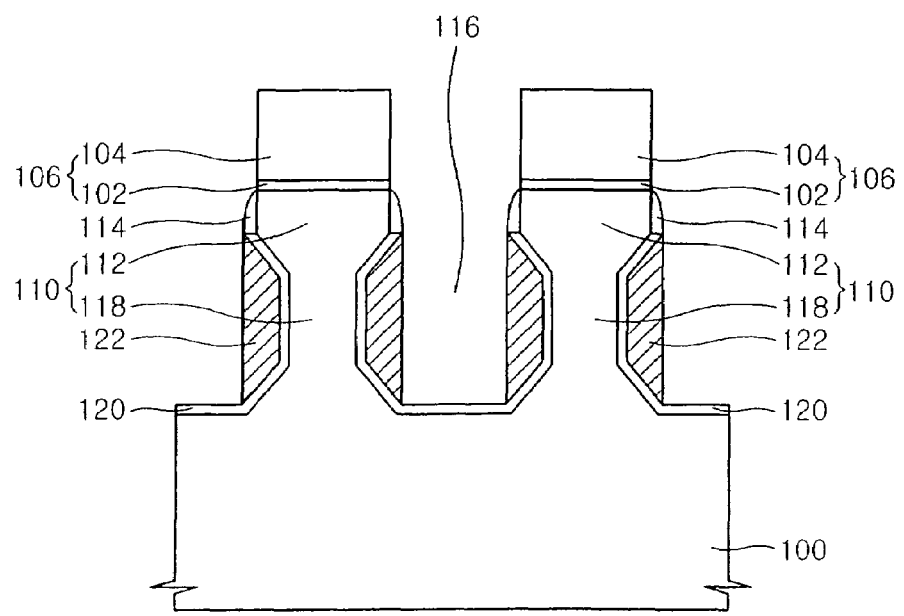
Figure 14B:
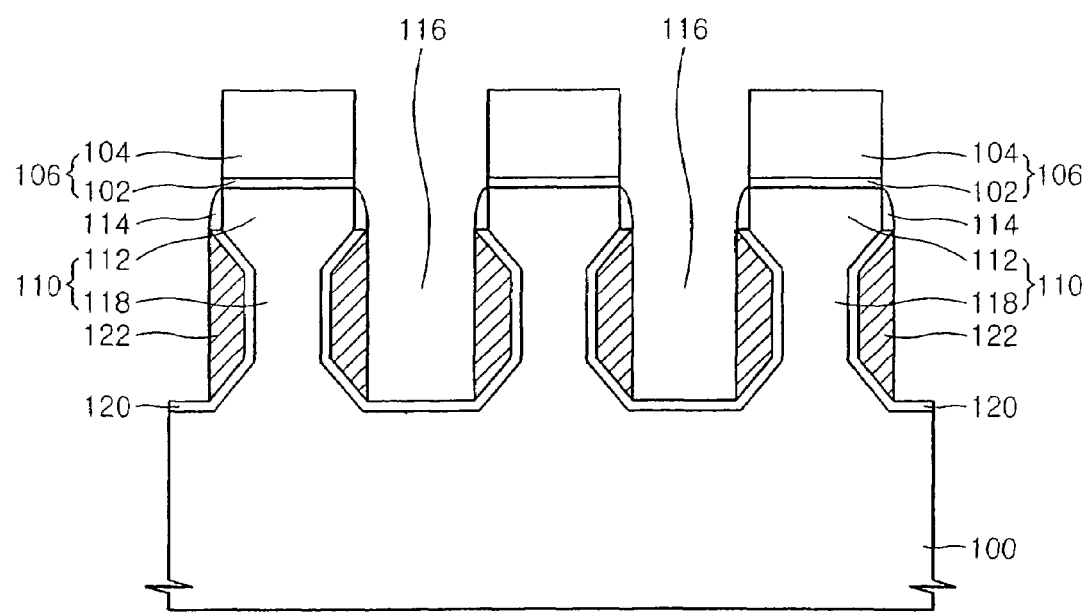

Referring to FIGS. 14A and 14B, a conductive material covering the gate insulating layer 120 in the trench 116 is deposited with a thickness enough to completely fill the trench 116 so as to form a conductive layer, and the conductive layer is etched back. As a result, only a portion of the conductive layer surrounding an outer circumference of the lower pillar 118 having a width smaller than a width $W_1$ of the upper pillar 112 in the active pillar 110 remains. Thus, the portion of the conductive layer surrounding an outer circumference of the lower pillar 118 forms a ring-shaped, cylindrical, rounded or toroidal gate 122, collectively referred to herein as "ring-shaped". This definition of "ring-shaped" as used in the present description also includes other shapes such as square or rectangular, or other, shapes, which can have rounded corners.

Since the ring-shaped insulation spacer 114 is used as an etch mask to pattern the ring-shaped gate 122 and has etch selectivity relative to the gate material, the resulting outer width of the patterned ring-shaped gate 122 is less than an outer width of a widest portion of the ring-shaped insulation spacer 114.

The conductive layer to form the ring-shaped gate 122 may be formed of, for example, a polysilicon layer doped with n-type impurities, a polysilicon layer doped with p-type impurities, or a silicon germanium layer.

Figure 15A:
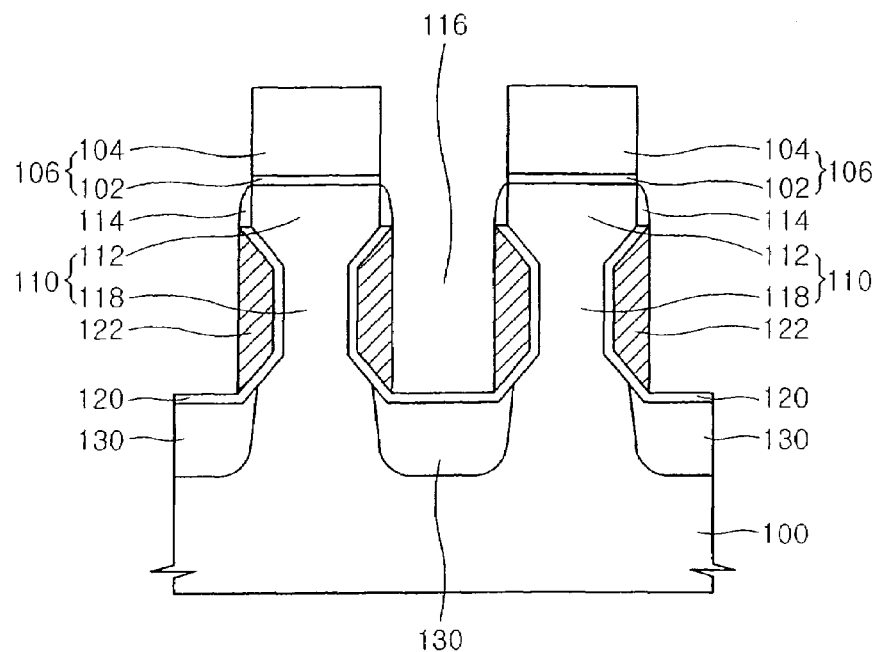
Figure 15B:
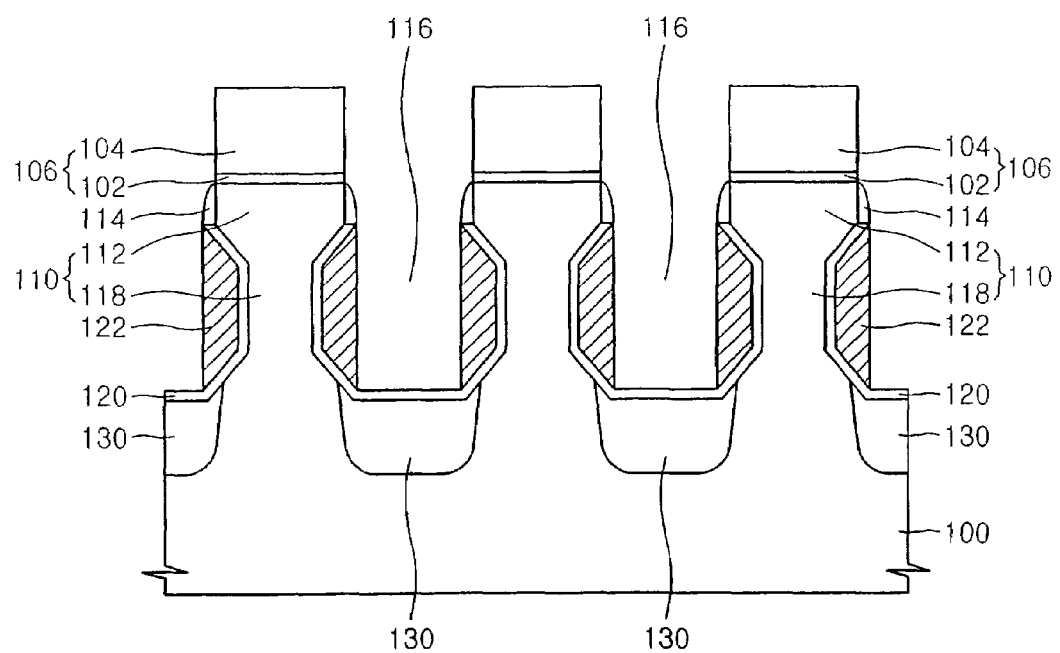

Referring to FIGS. 15A and 15B, impurities, for example, phosphoric (P) ions or arsenic (As) ions are implanted into the semiconductor substrate 100 below the gate insulating layer 120 exposed inside the trench 116 between the active pillars 110, thereby forming bottom source/drain regions 130 in the semiconductor substrate 100 between the active pillars 110.

Figure 16A:
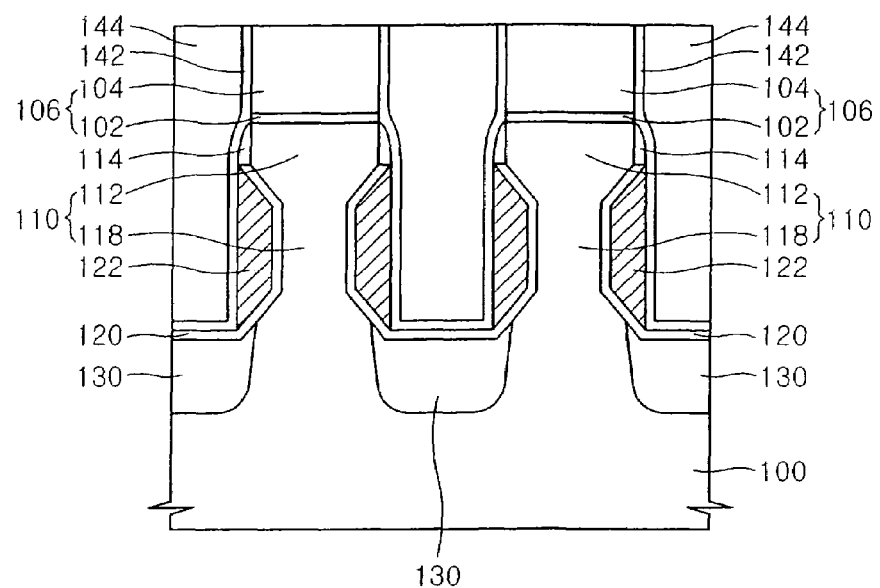
Figure 16B:
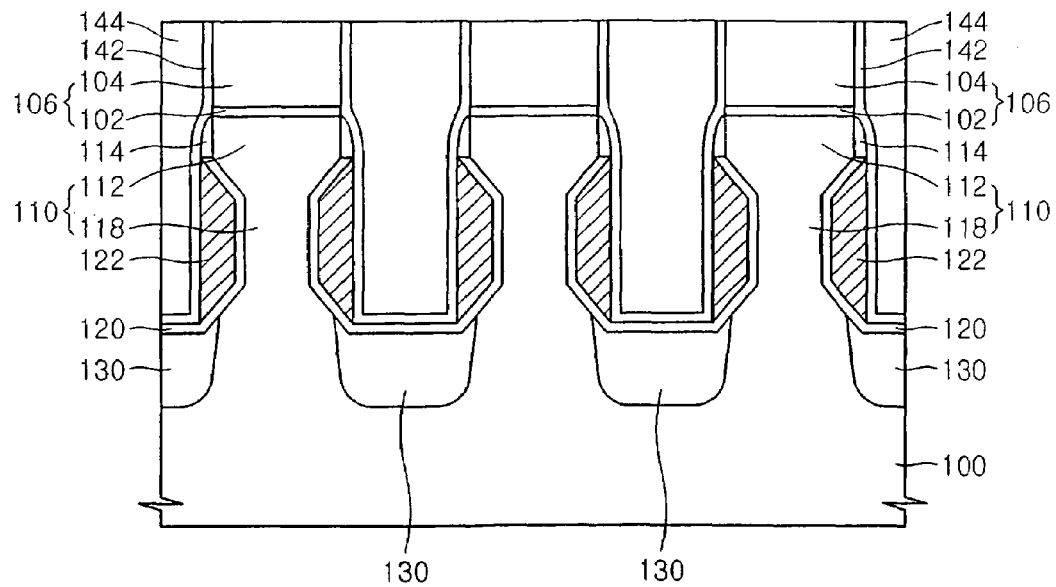

Referring to FIGS. 16A and 16B, after an etch stop layer 142 is formed on the inner wall of the trench 116, the inside of the trench 116 is filled with a first oxide layer 144, and the upper surface of the resulting structure is planarized. The etch stop layer 142 may be formed of, for example, a silicon nitride layer. The etch stop layer 142 operates to protect the outer circumference surface of the ring-shaped gate 122.

Figure 2:
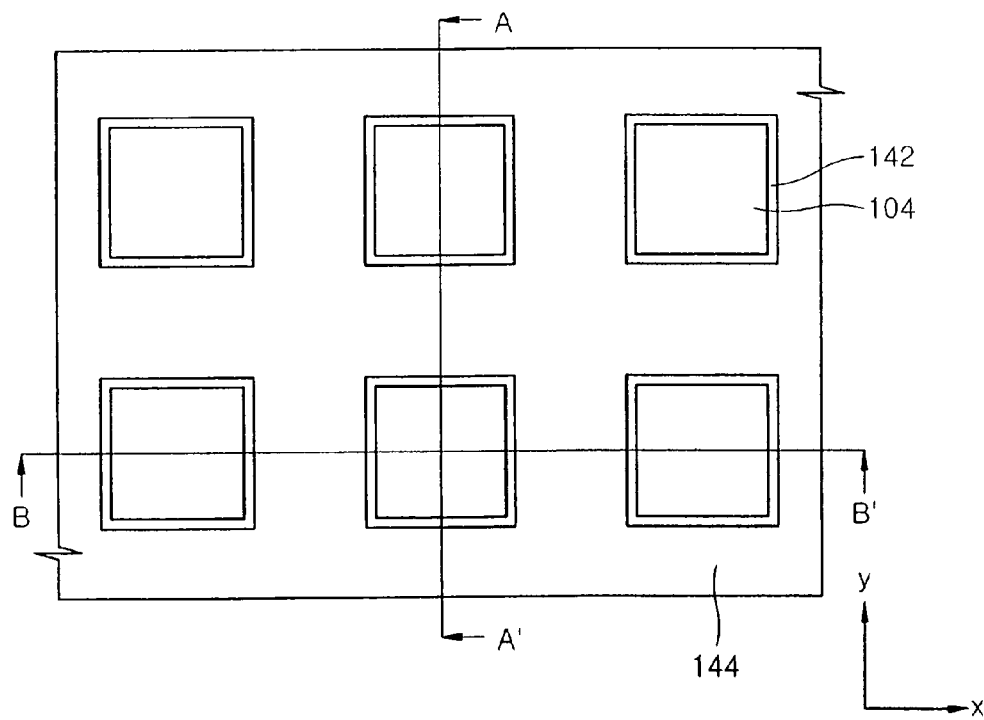

FIG. 2 is a schematic plan view of FIGS. 16A and 16B. That is, FIG. 16A is a sectional view taken along a line A-A' of FIG. 2, and FIG. 16B is a sectional view taken along a line B-B' of FIG. 2.

Figure 17A:
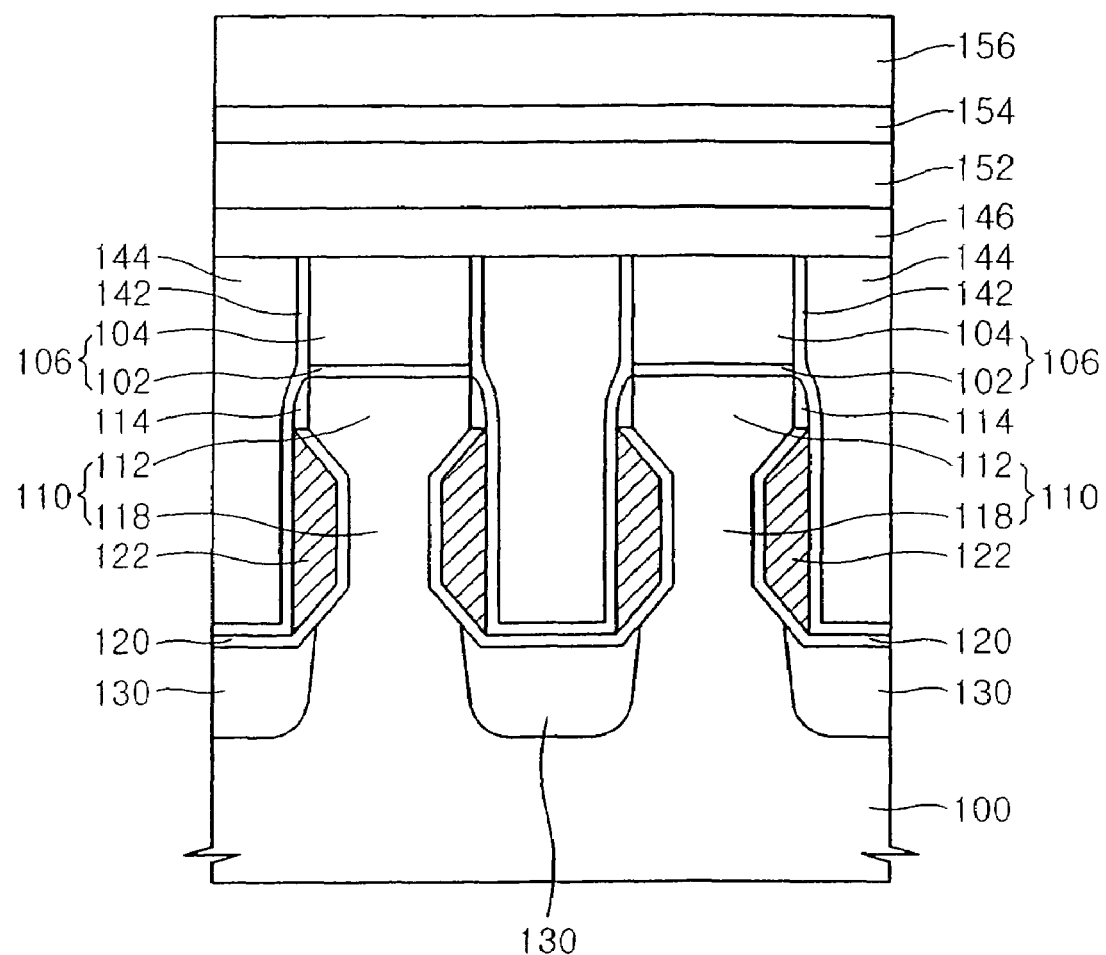

Referring to FIGS. 17A and 17B, a planarized second oxide layer 146 is formed to cover the exposed upper surface of the semiconductor substrate 100 including the upper surface of the hard mask layer 104 and the upper surface of the planarized first oxide layer 144. Then, in order to form an etch mask pattern for defining a bit line, a carbon-containing layer, for example, an amorphous carbon layer (ACL) 152, a hard mask layer 154, and a photoresist pattern 156 are sequentially formed on the second oxide layer 146. The hard mask layer 154 may be formed of a composite layer including, for example, plasma-enhanced tetraethyl orthosilicate (PTEOS) and SiON, which are sequentially stacked.

The hard mask layer 154 is etched, using the photoresist pattern 156 as an etch mask, and the ACL is etched, using the hard mask layer 154 as an etch mask, thereby forming a hole 158 exposing an upper surface of the second oxide layer 146.

Figure 3:
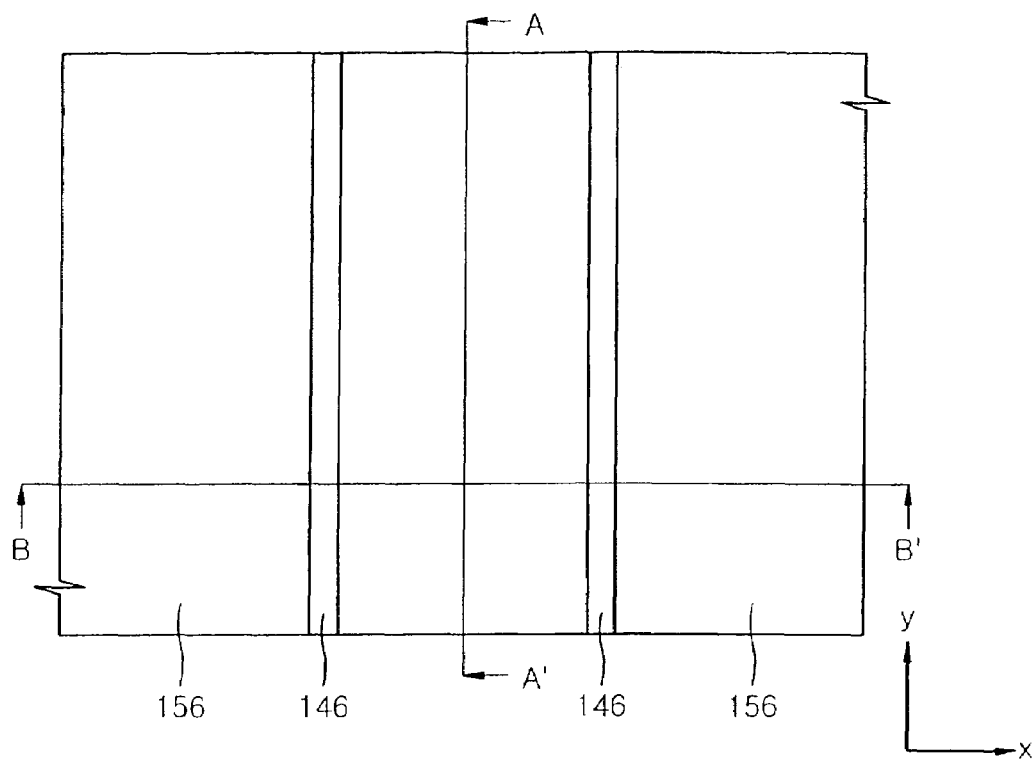

FIG. 3 is a schematic plan view of FIGS. 17A and 17B. That is, FIG. 17A is a sectional view taken along a line A-A' of FIG. 3, and FIG. 17B is a sectional view taken along a line B-B' of FIG. 3.

While FIG. 3 and FIGS. 17A and 17B illustrate that the hard mask layer 154 and the photoresist pattern 156 are remain after the ACL 152 is etched, these layers may optionally be partially or entirely consumed and removed during the etching of the hard mask layer 154 and the ACL 152.

Figure 18A:
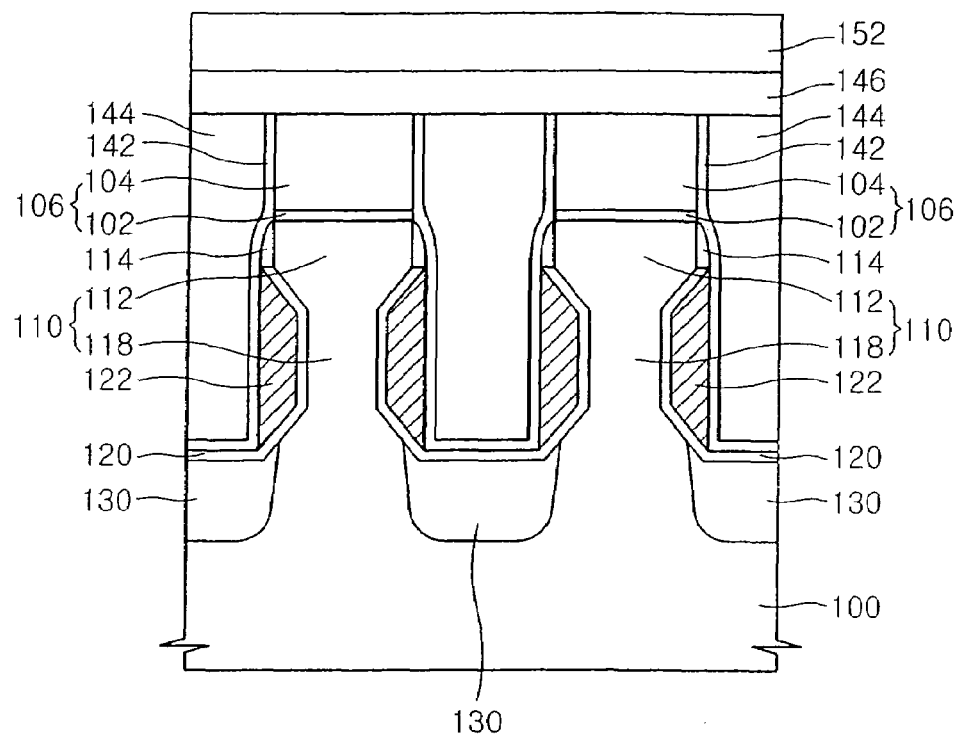
Figure 18B:
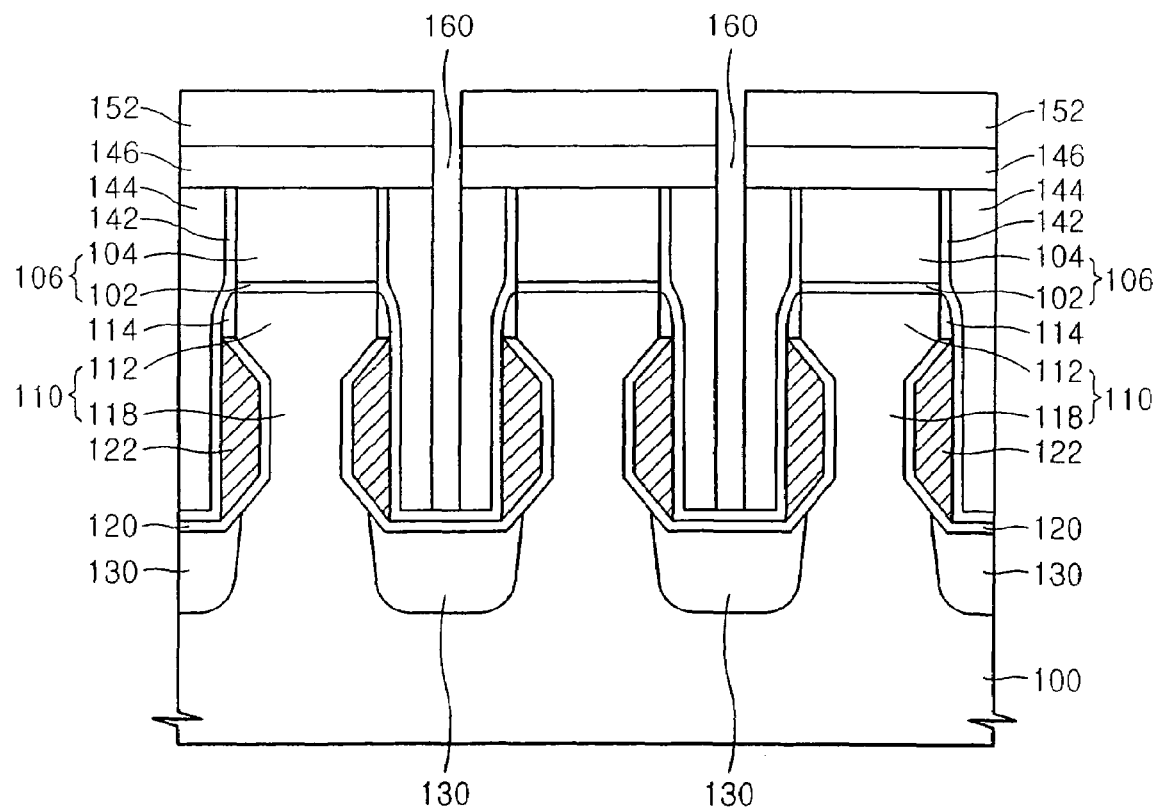

Referring to FIGS. 18A and 18B, the second oxide layer 146 exposed through the hole 158, and the first oxide layer 144 therebelow are sequentially etched, using the ACL 152 as an etch mask, thereby forming a trench line 160 isolating a bit line and exposing the etch stop layer 142 formed on the inner wall of the trench 116. At this time, when a misalignment occurs during the photolithography process explained in reference to FIGS. 17A and 17B, since the ring-shaped gate 122 formed around the active pillar 100 is protected by the etch stop layer 142 during the etching of the first oxide layer 144, sufficient process margins can be ensured.

Figure 4:
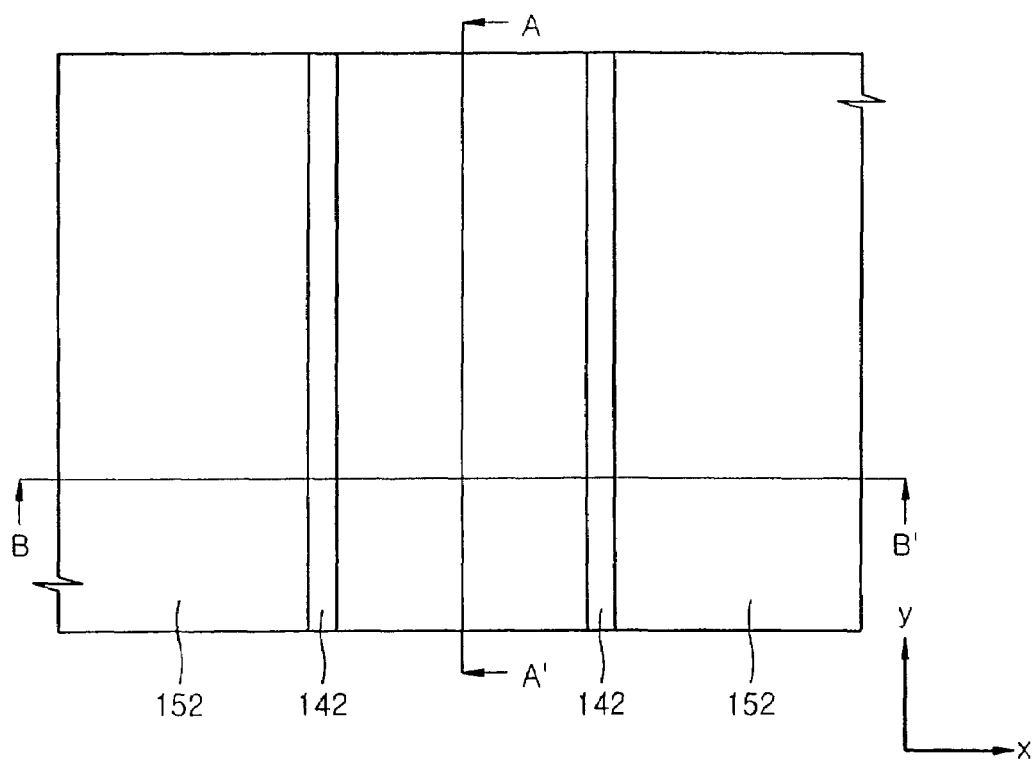

FIG. 4 is a schematic plan view of FIGS. 18A and 18B. That is, FIG. 18A is a sectional view taken along a line A-A' of FIG. 4, and FIG. 18B is a sectional view taken along a line B-B' of FIG. 4.

Figure 19A:
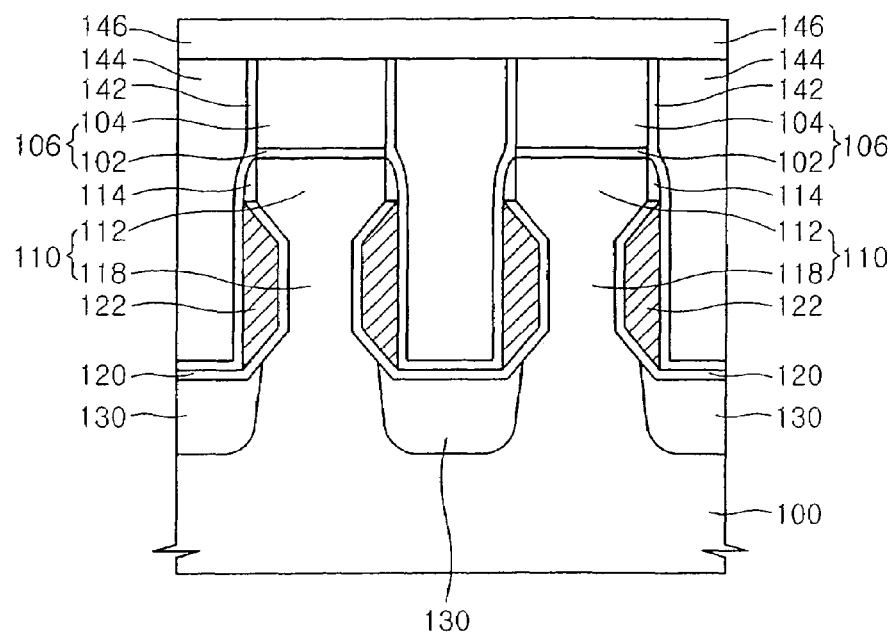
Figure 19B:
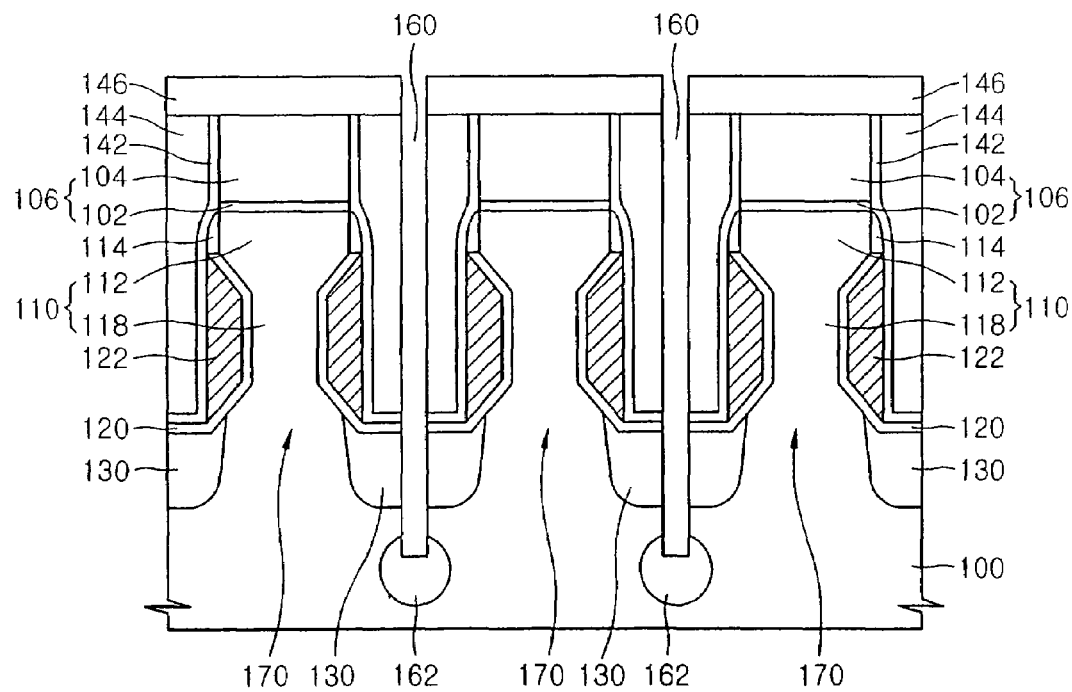

Referring to FIGS. 19A and 19B, the etch stop layer 142 exposed through the trench line 160, the gate insulating layer 120 therebelow, the bottom source/drain region 130, and the semiconductor substrate 100 are etched, using the second oxide layer 146 as an etch mask, so as to further extend the trench line 160. As a result, a buried bit line 170 confined by the trench line 160 is formed in the semiconductor substrate 100.

As described above, the buried bit line 170 is formed by a photolithography process using the photoresist pattern 156 (refer to FIGS. 17A and 17B). Thus, the buried bit line 170 has a uniform width along its longitudinal direction, and has a uniform resistance distribution along its longitudinal direction. Therefore, a stable resistance characteristic can be maintained in the buried bit line 170.

In the meantime, the thickness of the hard mask layer 104 functions as a factor in determining the resulting thickness of a buried contact to be formed in a subsequent process in order to electrically connect the source/drain region to a lower electrode of a capacitor. Thus, since the thickness of the hard mask layer 104 is determinative of the thickness of the buried contact to be formed, it is necessary to protect the hard mask layer 104 not to be damaged until the buried contact will be formed. In this embodiment, the hard mask layer 104 can be protected by the second oxide layer 146 during the etching of the trench line 160.

If necessary, an ion implantation process can be performed in the trench line 160, thereby forming an ion implantation region 162 to provide an isolation function in the semiconductor substrate 100.

Figure 5:
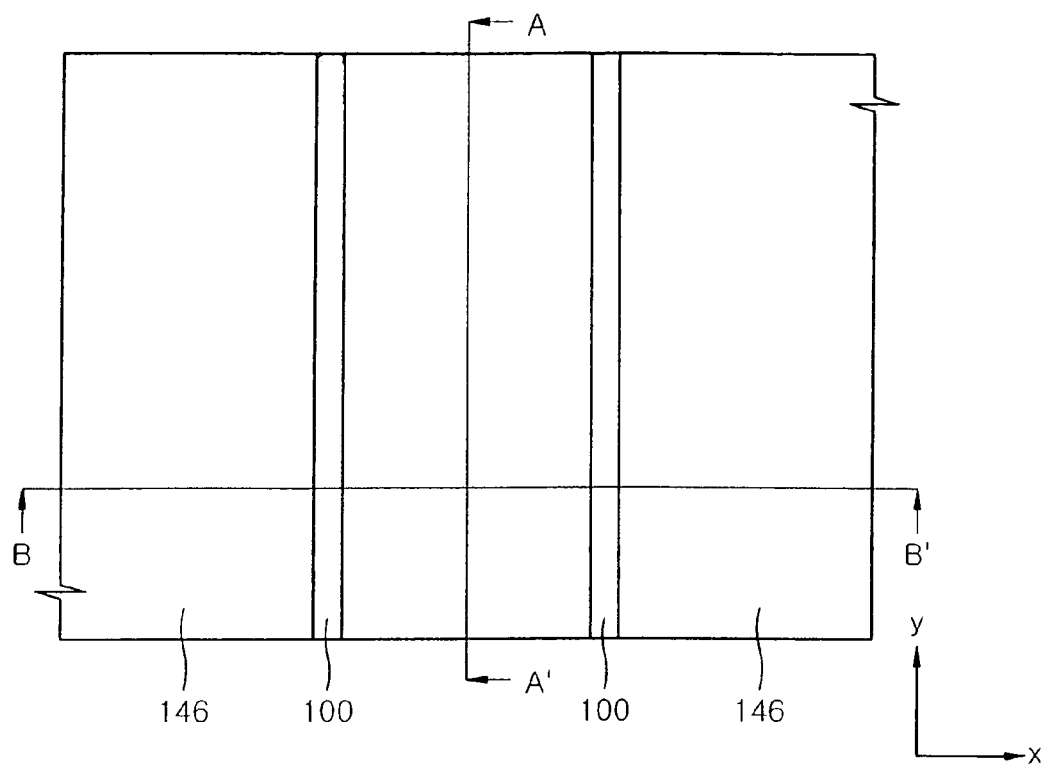

FIG. 5 is a schematic plan view of FIGS. 19A and 19B. That is, FIG. 19A is a sectional view taken along a line A-A' of FIG. 5, and FIG. 19B is a sectional view taken along a line B-B' of FIG. 5.

Figure 20A:
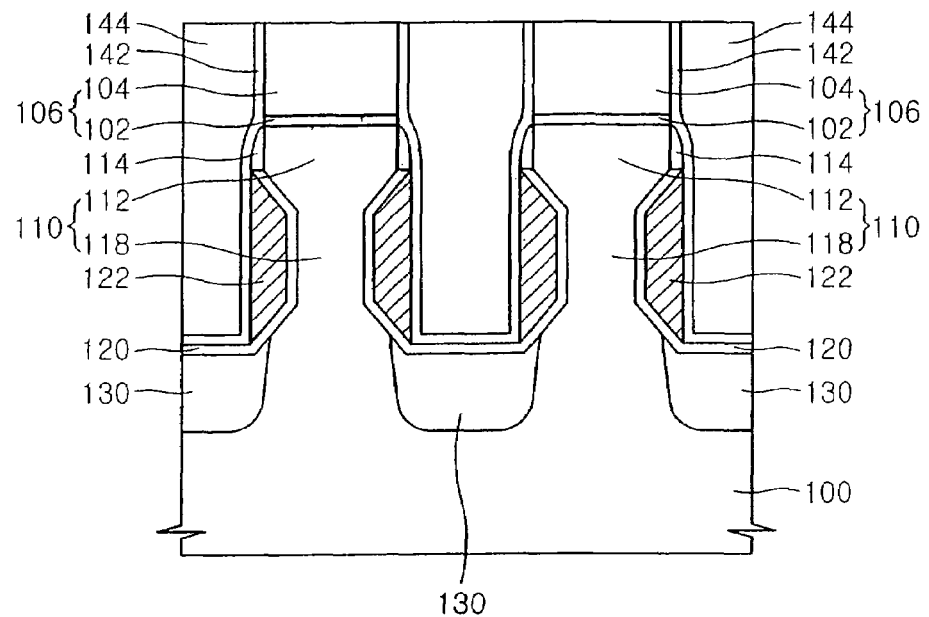
Figure 20B:
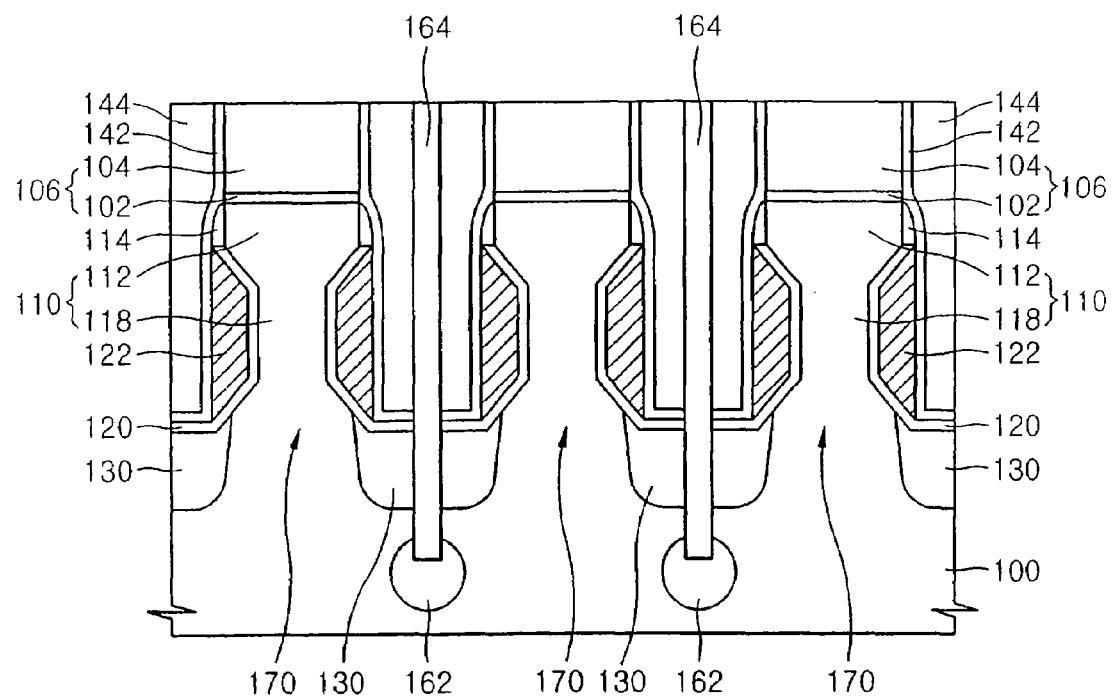

Referring to FIGS. 20A and 20B, the inside of the trench line 160 is filled with a third oxide layer 164, and an upper surface of the structure is planarized using a chemical mechanical polishing (CMP) process, so as to expose an upper surface of the hard mask layer 104.

Figure 6:
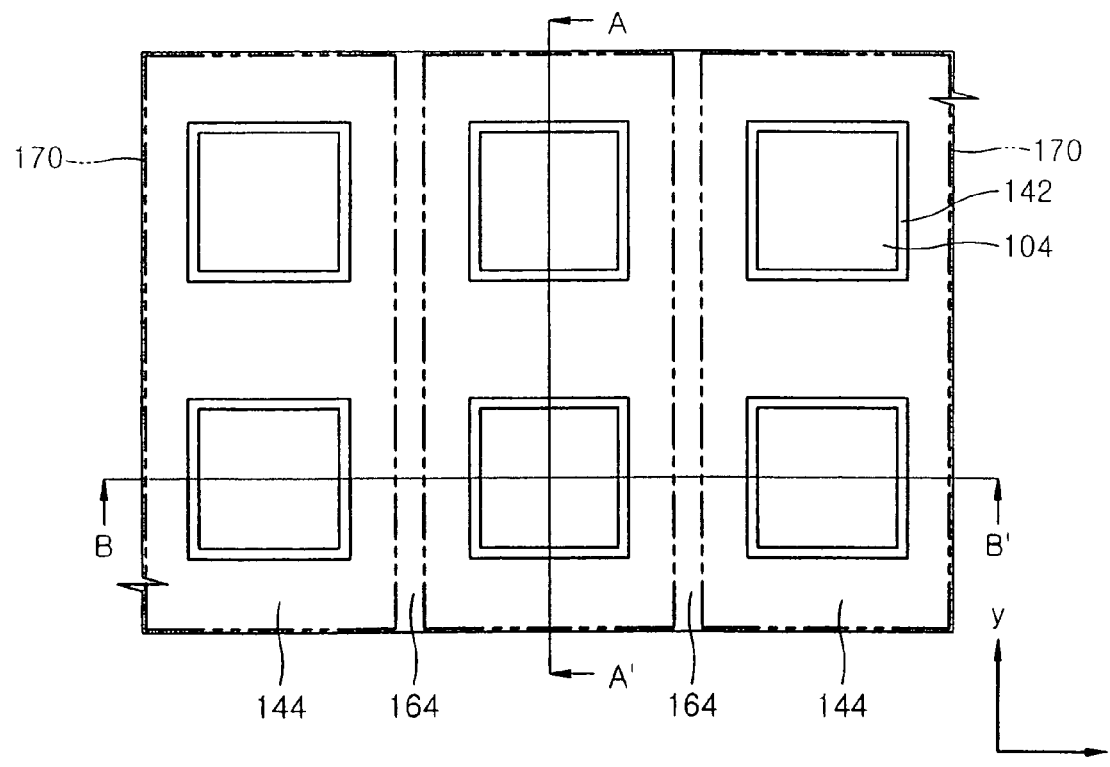

FIG. 6 is a schematic plan view of FIGS. 20A and 20B. That is, FIG. 20A is a sectional view taken along a line A-A' of FIG. 6, and FIG. 20B is a sectional view taken along a line B-B' of FIG. 6.

Figure 21A:
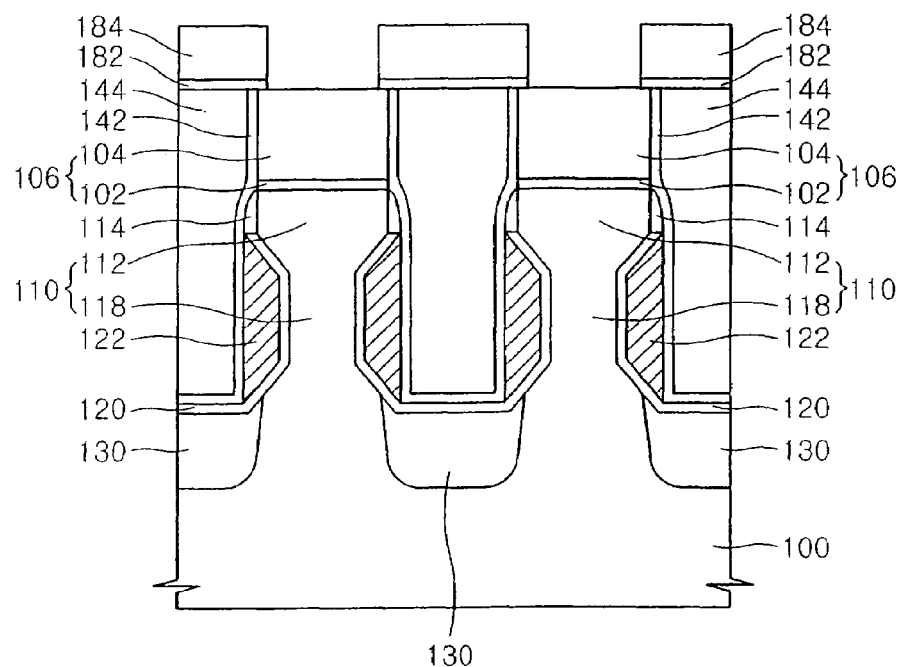
Figure 21B:
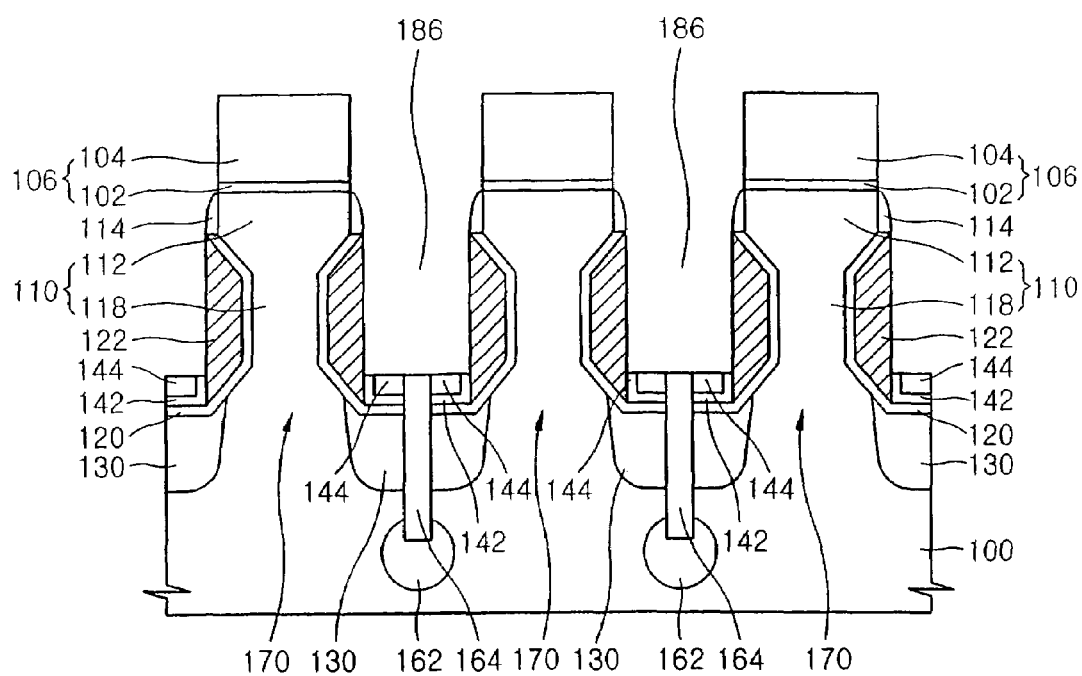

Referring to FIGS. 21A and 21B, a photoresist pattern 184 is formed on the first oxide layer 144 along the direction perpendicular to the buried bit line 170 with a line shape to expose the hard mask layer 104 on the semiconductor substrate 100. An organic anti-reflective layer 182 may be formed below the photoresist pattern 184 as illustrated in FIGS. 21A.

The first oxide layer 144, the third oxide layer 164, and the etch stop layer 142 inside the trench 116 are etched by a predetermined depth using the photoresist pattern 184 and the hard mask layer 104 as etch masks, and removed.

As a result, a word line hole 186 is formed inside the trench 116. An outer circumference surface of the ring-shaped gate 122 is partially exposed on the sidewall of the word line hole 186.

Figure 7:
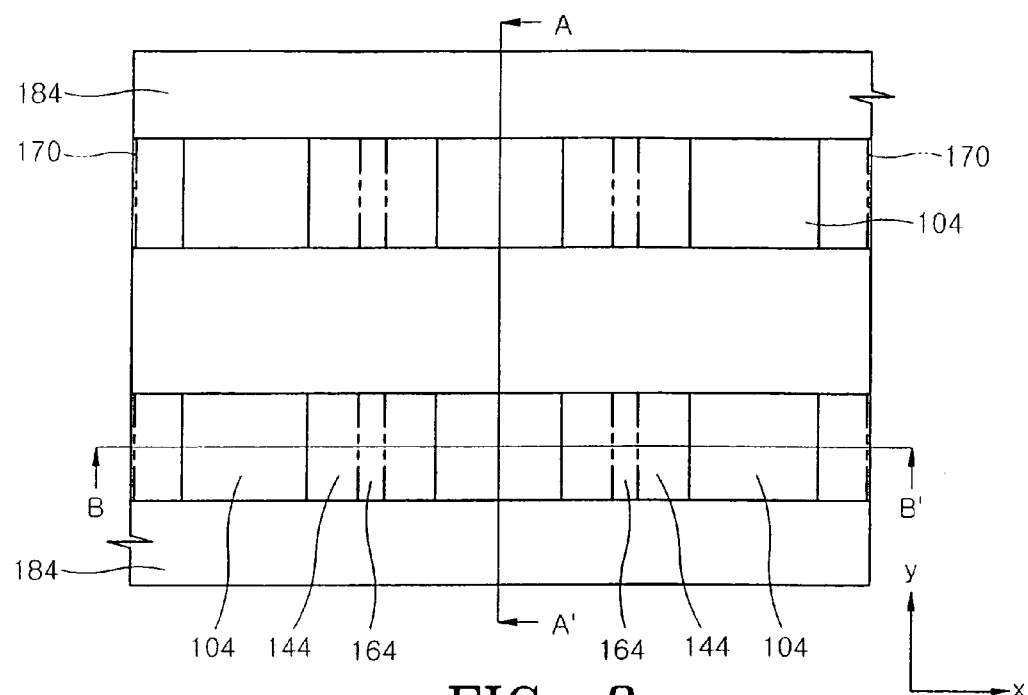

FIG. 7 is a schematic plan view of FIGS. 21A and 21B. That is, FIG. 21A is a sectional view taken along a line A-A' of FIG. 7, and FIG. 21B is a sectional view taken along a line B-B' of FIG. 7.

Figure 22A:
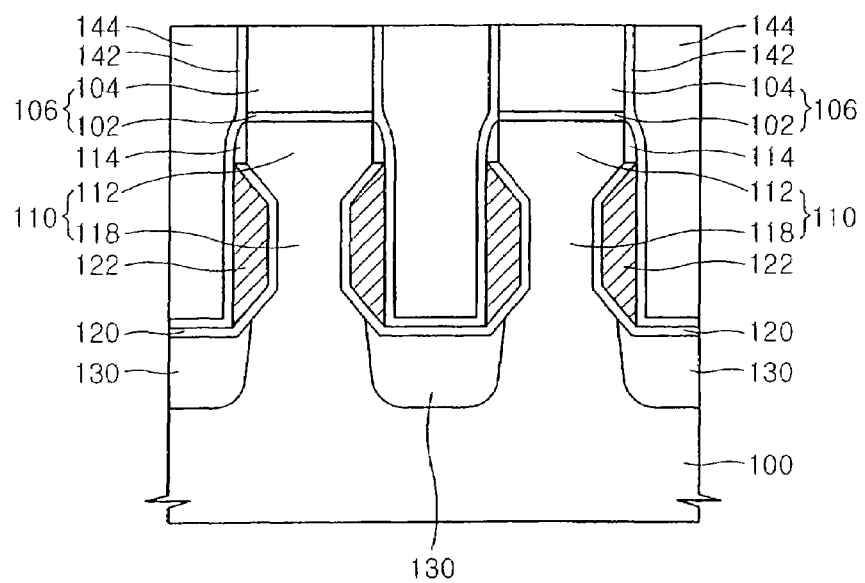
Figure 22B:
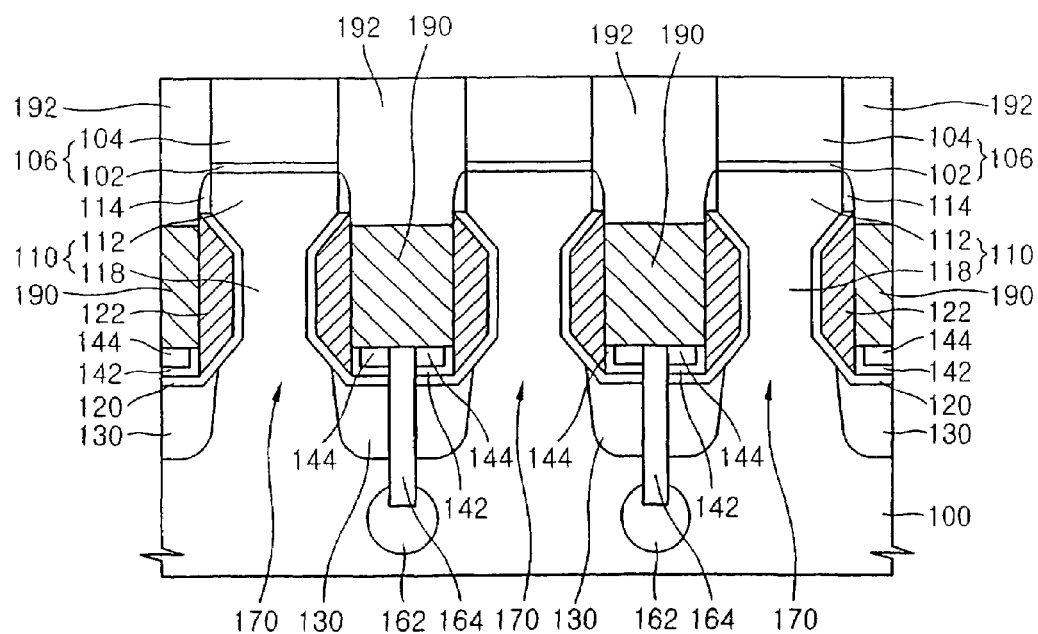

Referring to FIGS. 22A and 22B, after the photoresist pattern 184 and the organic anti-reflective layer 182 are removed, and the inside of the word line hole 186 is filled with a conductive material for forming a word line, an etch-back process is again performed, thereby forming a word line 190. The word line 190 that is electrically connected to the ring-shaped gate 122 extends with a line shape in a direction that is perpendicular to the buried bit line 170. The conductive material for forming the word line may be, for example, doped polysilicon, a transition metal layer such as tungsten (W), cobalt (Co), nickel (Ni) and titanium (Ti), a transition metal silicide layer such as tungsten silicide (WSi$_x$), cobalt silicide (CoSi$_x$), nickel silicide (NiSi$_x$) and titanium silicide (TiSi$_x$), and a combination thereof.

Then, after a fourth oxide layer 192 is formed to fill the rest portion inside the word line hole 186 where the word line 190 is formed, an upper surface is planarized so as to expose an upper surface of the hard mask layer 104. The fourth oxide layer 192 covers an upper sidewall of the active pillar 110 and a sidewall of the hard mask layer 104 on the word line 190.

Figure 8:
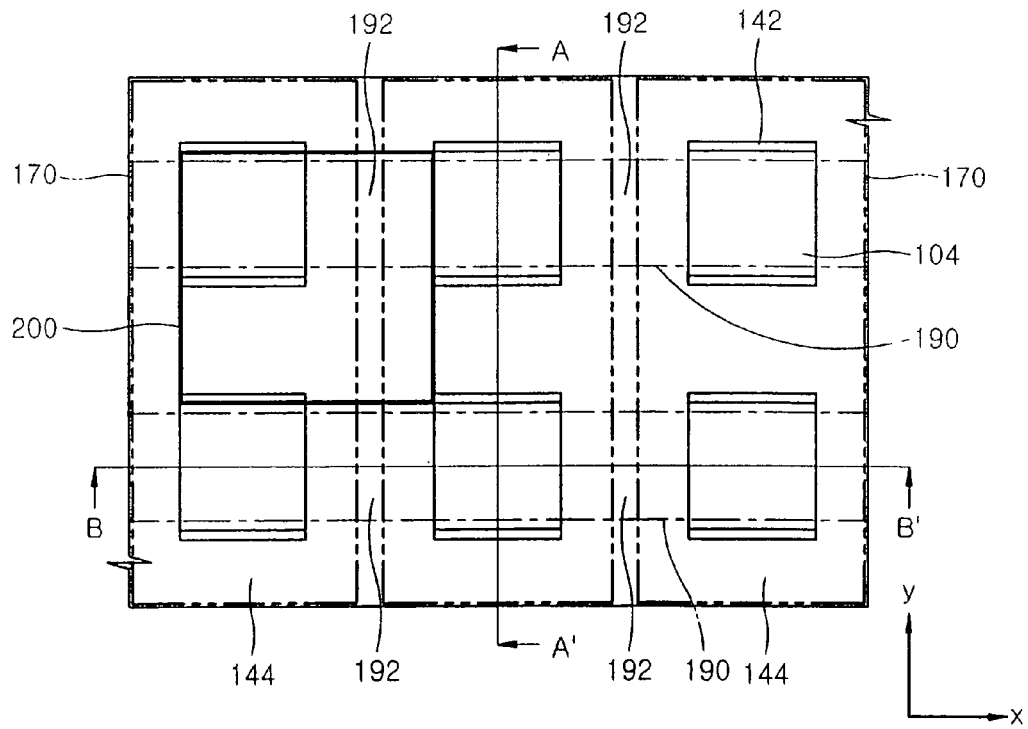

FIG. 8 is a schematic plan view of FIGS. 22A and 22B. That is, FIG. 22A is a sectional view taken along a line A-A' of FIG. 8, and FIG. 22B is a sectional view taken along a line B-B' of FIG. 8.

Figure 23A:
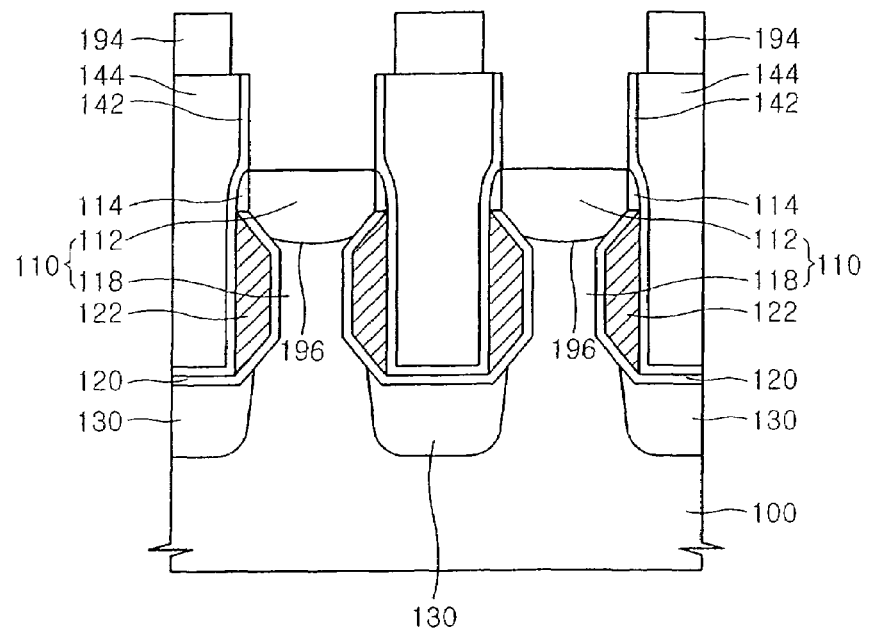
Figure 23B:
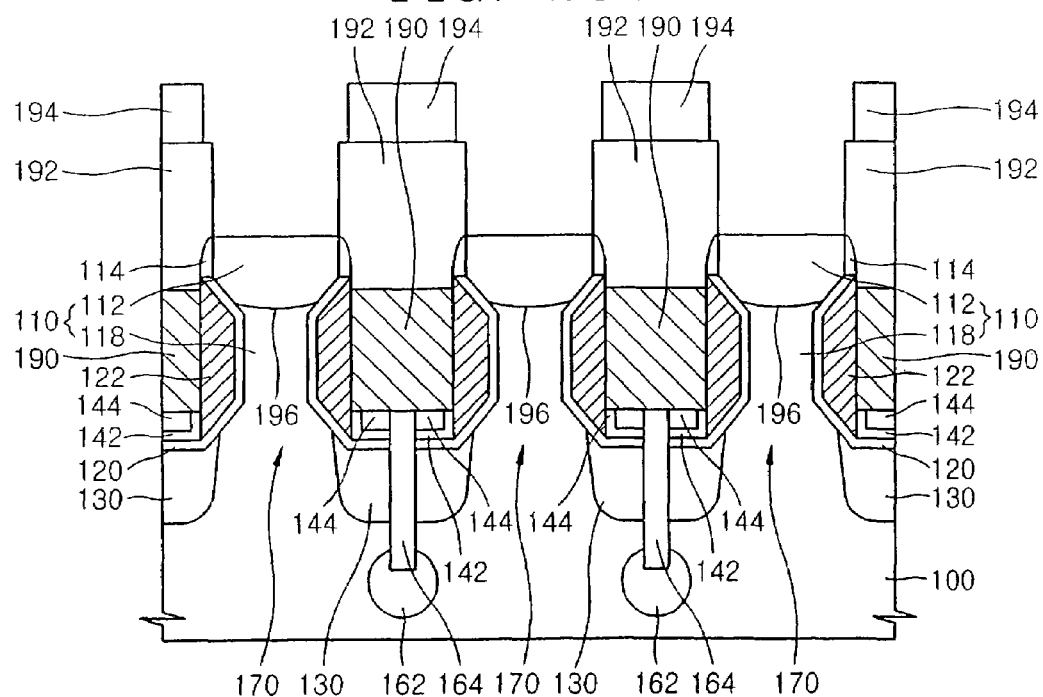

Referring to FIGS. 23A and 23B, after a mask pattern, which is composed of a fifth oxide layer 194 with an opening exposing the hard mask layer 104, is formed on the third oxide layer 144 and the fourth oxide layer 192, the hard mask layer 104 exposed through the opening and the pad oxide layer 102 therebelow are removed using the fifth oxide layer 194 as an etch mask, so as to expose an upper surface of the active pillar 110. Then, an ion implantation process is performed on an exposed upper surface of the active pillar 110, thereby forming a top source/drain region 196.

As a result, a vertical channel MOS transistor, which is composed of the active pillar 110, the ring-shaped gate 122 surrounding the outer circumference of the active pillar 110, and the bottom source/drain region 130 and the top source/drain region 196 respectively formed adjacent to the lower portion and the upper portion of the ring-shaped gate 122 along the longitudinal direction of the active pillar 110, is formed. In the vertical channel MOS transistor realized as above, its channel is formed to have a vertical orientation along the longitudinal direction of the active pillar 110 between the bottom source/drain region 130 and the top source/drain region 196. Therefore, the channel may be provided with a sufficient length, while, at the same time, limiting the area occupied by the transistor in the horizontal direction.

Figure 24A:
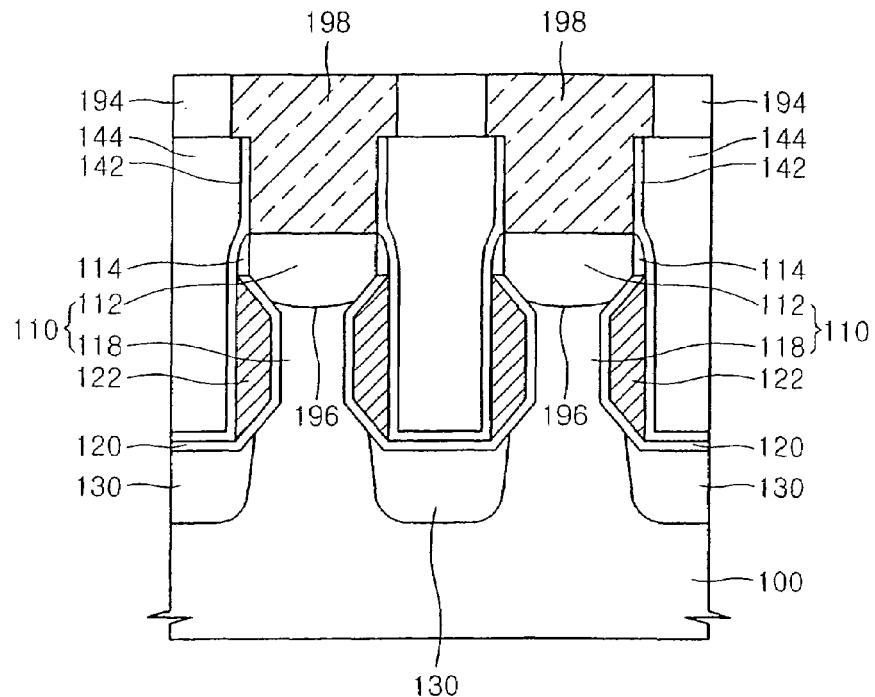
Figure 24B:
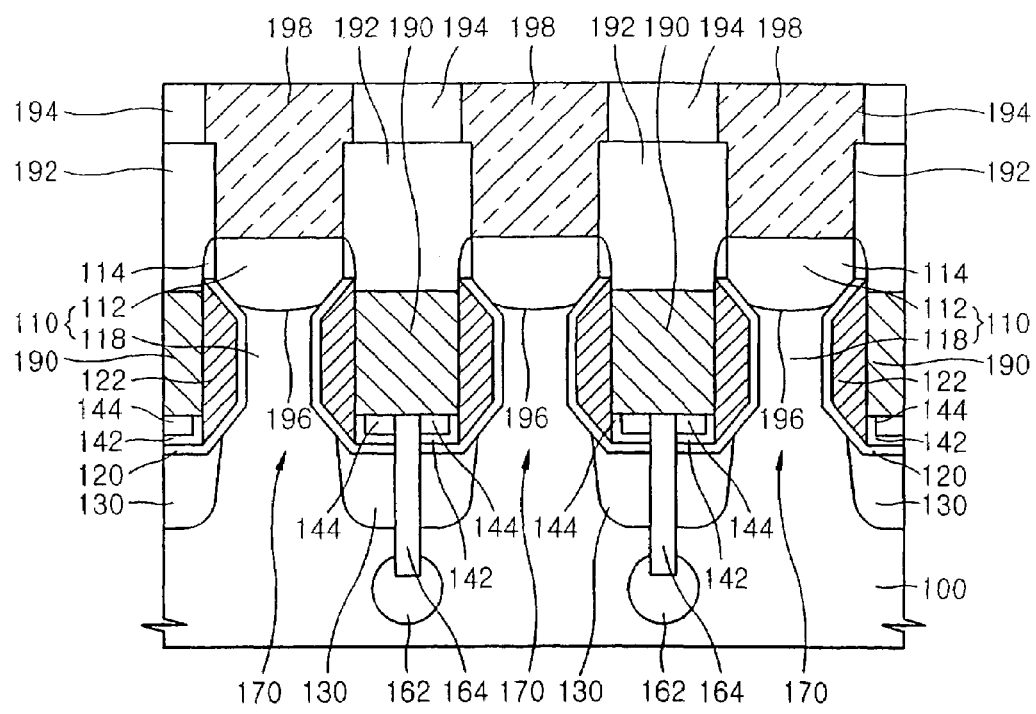

Referring to FIGS. 24A and 24B, a conductive layer 198 for forming a buried contact is formed on the top source/drain region 196. The conductive layer 198 for the buried contact may be, for example, doped polysilicon, a transition metal layer such as tungsten (W), cobalt (Co), nickel (Ni) and titanium (Ti), a transition metal silicide layer such as tungsten silicide (WSi$_x$), cobalt silicide (CoSi$_x$), nickel silicide (NiSi$_x$) and titanium silicide (TiSi$_x$), and a combination thereof.

In the semiconductor device fabricated by the method according to an embodiment of the present invention described as above, a cell area occupied by the unit cell region 200 (refer to FIGS. 1 and 8) formed by one vertical channel MOS transistor is 4F$^2$ as described in reference to FIG. 1. That is, respective widths of the active pillar 110, which is confined by the hard mask layer 104, in the x direction and the y direction are substantially the same, and the width thereof is 1F as a minimum feature size of the semiconductor device to be fabricated. Further, the plurality of active pillars 110 are spaced apart from each other by a distance equal to the width 1F of the active pillar 110 between two neighboring active pillars 110 respectively in the x direction and the y direction. Thus, a cell area occupied by one unit cell area 200 where one active pillar 110 is formed is 4F$^2$.

Further, since the channel in the vertical structure of the MOS transistor according to an embodiment of the present invention is formed along the vertical direction with respect to the primary upper surface of the semiconductor substrate 100, the channel length can be increased without increasing the area occupied by the cell in the horizontal direction. Therefore, the short channel effect can be prevented.

In order to realize the vertical structure of the MOS transistor having a unit cell area of 4F$^2$ in the semiconductor device according to the present invention, the buried bit line is formed by a photolithography process. Thus, since the buried bit line has a uniform width along its longitudinal direction, a uniform resistance distribution is provided along the longitudinal direction of the buried bit line. Therefore, a stable resistance characteristic can be maintained in the buried bit line. Further, when the buried bit line is formed by a photolithography process, even though a misalignment is generated, the ring-shaped gate formed around the active pillar can be protected by the etch stop layer formed therearound. Therefore, processes for realizing the vertical structure of the MOS transistor having a unit cell area of $4F^2$ can be simplified, and process margins can be increased.

Further, according to the present invention, respective planar widths of the active pillar constituting one unit cell in the x direction and the y direction are same, and a distance between any two neighboring active pillars is equal to the width of the active pillar. Therefore, since alignment in the x direction and the y direction is symmetrical based on the active pillar inside one unit cell, processing difficulties experienced in the conventional asymmetrical structure can be overcome, and the cell array formation process can be simplified.

As described above, in the formation of the vertical structure of the MOS transistor capable of increasing a length of the transistor irrespective of the cell area in the horizontal direction, according to the present invention, the processes of fabricating semiconductor devices can be simplified and resistance characteristics of the bit line can be improved, and sufficient process margins in the formation of the bit line in the narrow area of the minimum feature size can be ensured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a cell array region having a plurality of unit cells, each unit cell having a cell occupation area, repeatedly aligned along a first direction and along a second direction, the first and second directions being perpendicular to each other in a horizontal direction along a primary surface of a semiconductor substrate, wherein each unit cell has a uniform first pitch in the first direction and in the second direction;
   an active pillar vertically extending from an active region of each unit cell integrally with the semiconductor substrate in a vertical direction that is perpendicular with respect to the primary surface of the semiconductor substrate, wherein widths of at least a portion of the active pillar in the first direction and in the second direction are equal to a first width 1F as a minimum feature size in the cell array region;
   a ring-shaped gate surrounding a sidewall of the active pillar;
   a channel region formed to extend along the active pillar in the vertical direction;
   a buried bit line formed below the active pillar in the semiconductor substrate; and
   a word line extending in the horizontal direction perpendicular to the buried bit line, and electrically connected to the ring-shaped gate, wherein
   a distance from the active pillar of any one unit cell of the plurality of unit cells to each of the active pillars of nearest neighboring unit cells in the first direction and the second direction is equal to the first width of the active pillar of one unit cell.

2. The semiconductor device of claim 1, wherein each of the plurality of unit cells has a cell occupation area of $4F^2$.

3. The semiconductor device of claim 1, wherein the bit line extends along either one direction of the first direction and the second direction with a uniform width.

4. The semiconductor device of claim 1, wherein the active pillar comprises an upper active portion having the first width in the first direction and the second direction, and a lower active portion having a smaller width than the first width in the first direction and the second direction, and
   the ring-shaped gate is formed to surround a sidewall of the lower active portion of the active pillar.

5. The semiconductor device of claim 1, wherein the ring-shaped gate comprises an inner circumference surface about a sidewall of the lower active portion of the active pillar, and an outer circumference surface contacting the word line.

6. The semiconductor device of claim 1, further comprising a gate dielectric layer between the ring-shaped gate and the sidewall of the active pillar.

7. A semiconductor device comprising:
   a cell array region having a plurality of unit cells, each unit cell having a cell occupation area in a semiconductor substrate;
   an active pillar extending in a vertical direction with respect to the substrate from an active region of each unit cell in the cell array region, the active pillar having a first width portion and a second width portion, the second width portion having a width that is greater than a width of the first width portion;
   a ring-shaped insulation spacer on a sidewall of the second width portion of the active pillar, the ring-shaped insulation spacer having an inner surface and an outer surface;
   a gate dielectric layer on a sidewall of the active pillar;
   a ring-shaped gate on a portion of the gate dielectric layer formed on the sidewall of the active pillar, the ring-shaped gate having an inner surface contacting the gate dielectric layer and an outer surface;
   a channel region formed to extend in the vertical direction of the active pillar;
   a first source/drain region formed at a bottom portion of the active pillar;
   a second source/drain region formed at a top portion of the active pillar; and
   wherein a width of a widest portion of the outer surface of the ring-shaped gate is equal to or less than that of a widest portion of the outer surface of the ring-shaped insulation spacer.

8. The semiconductor device of claim 7, further comprising a buried bit line formed below the active pillar in the semiconductor substrate and electrically connected to the first source/drain region.

9. The semiconductor device of claim 7, further comprising a word line extending in a horizontal direction and electrically connected to the ring-shaped gate.

10. The semiconductor device of claim 7, further comprising a capacitor electrically connected to the second source/drain region.

11. The semiconductor device of claim 7, further comprising an insulating layer pattern bisecting neighboring first source/drain regions of neighboring unit cells.

12. The device of claim 11, further comprising an ion implantation region below the insulating layer pattern.

13. A method of fabricating a semiconductor device comprising:

forming a plurality of active pillars on a semiconductor substrate to extend in a vertical direction relative to a horizontal primary surface of the semiconductor substrate, the plurality of active pillars formed integrally with the semiconductor substrate;

forming a gate insulating layer covering a surface of the active pillar;

forming a ring-shaped gate surrounding a sidewall of the active pillar on the gate insulating layer in a region of the active pillar;

implanting ions into a region of the semiconductor substrate adjacent to the ring-shaped gate, thereby forming a bottom source/drain region;

covering an outer surface of the ring-shaped gate and the bottom source/drain region with an etch stop layer;

etching the etch stop layer, the bottom source/drain region, and the semiconductor substrate therebelow in a region between two neighboring active pillars of the plurality of active pillars using a photolithography process, thereby defining a buried bit line below the active pillar in the semiconductor substrate; and forming a word line electrically connected to the ring-shaped gate in a region between two neighboring active pillars of the plurality of active pillars.

14. The method of claim 13, wherein the forming of the buried bit line comprises:

forming a first insulating layer on the bottom source/drain region to completely fill a space between two neighboring active pillars of the plurality of active pillars;

sequentially forming a planarized second insulating layer, a carbon-containing layer, a hard mask layer, and a photoresist pattern on the first insulating layer;

etching the hard mask layer using the photoresist pattern as an etch mask;

etching the carbon-containing layer using the hard mask layer as an etch mask;

etching the planarized second insulating layer and the first insulating layer using the carbon-containing layer as an etch mask, thereby exposing the etch stop layer covering the bottom source/drain region; and etching the etch stop layer, the bottom source/drain region, and the semiconductor substrate using the planarized second insulating layer as an etch mask, thereby forming a trench line bisecting neighboring first source/drain regions into two isolated regions and thereby defining the buried bit line below the active pillar in the semiconductor substrate.

15. The method of claim 14, wherein the etch stop layer is formed of a nitride layer, and the first insulating layer is formed of an oxide layer.

16. The method of claim 14, wherein the planarized second insulating layer is formed of an oxide layer.

17. The method of claim 14, wherein the carbon-containing layer is formed of an amorphous carbon layer (ACL).

18. The method of claim 14, wherein the hard mask layer is one selected from an oxide layer, an oxynitride layer, and a combination thereof.

19. The method of claim 14, further comprising, after forming the hole defining the buried bit line, performing an ion implantation process into the hole, thereby forming an ion implantation region for isolation in the semiconductor substrate.

20. The method of claim 13, wherein the word line is formed to extend in the direction perpendicular to the buried bit line.

21. The method of claim 20, wherein the forming of the word line comprises:

partially exposing an outer surface of the ring-shaped gate in a region between two neighboring active pillars of the plurality of active pillars; and depositing a conductive material on the region, thereby forming the word line contacting a surface of the exposed ring-shaped gate.

22. The method of claim 14, wherein the forming of the word line comprises:

filling the inside of the hole with a third insulating layer after forming the hole;

removing a portion of the first insulating layer, a portion of the third insulating layer, and a portion of the etch stop layer in the region between two neighboring active pillars, so as to partially expose an outer surface of the ring-shaped gate; and depositing a conductive material on the predetermined region, thereby forming the word line contacting an exposed outer surface of the ring-shaped gate.

23. The method of claim 22, wherein the third insulating layer is formed of an oxide layer.

24. The method of claim 13, further comprising:

forming a top source/drain region on an end of the active pillar opposite the semiconductor substrate, so as to form a vertical channel region along the longitudinal direction of the active pillar; and forming a contact contacting the top source/drain region on the active pillar.

25. The method of claim 24, wherein the contact is a contact connecting the top source/drain region to a lower electrode of a capacitor.

26. The method of claim 24, wherein the forming of the plurality of active pillars comprises:

forming a plurality of mask patterns defining an active pillar region in the semiconductor substrate; and etching the semiconductor substrate using the mask pattern as an etch mask, thereby forming the active pillar, and wherein forming the contact comprises:

forming a fourth insulating layer concurrently covering a sidewall of the active pillar and a sidewall of the mask pattern in a state that the mask pattern covers an upper surface of the active pillar;

forming a fifth insulating layer having an opening exposing an upper surface of the mask pattern on the fourth insulating layer;

removing the mask pattern exposed through the opening of the fifth insulating layer, so as to expose the upper surface of the active pillar; and depositing a conductive material on the upper surface of the active pillar to fill an opening of the fifth insulating layer, thereby forming the contact contacting the upper surface of the active pillar.

27. The method of claim 26, wherein the fourth insulating layer and the fifth insulating layer are respectively formed of oxide layers.

28. A method of fabricating a semiconductor device comprising:

providing a cell array region having a plurality of unit cells, each unit cell having a cell occupation area in a semiconductor substrate;

forming an active pillar extending in a vertical direction with respect to the substrate from an active region of each unit cell in the cell array region, the active pillar having a first width portion and a second width portion, the second width portion having a width that is greater than a width of the first width portion;

forming a gate dielectric layer on a sidewall of the active pillar;

forming a ring-shaped insulation spacer on a sidewall of the second width portion of the active pillar, the ring-shaped insulation spacer having an inner surface and an outer surface;

forming a ring-shaped gate on a portion of the gate dielectric layer formed on the sidewall of the active pillar, the ring-shaped gate having an inner surface contacting the gate dielectric layer and an outer surface;

forming a channel region formed to extend in the vertical direction of the active pillar;

forming a first source/drain region formed at a bottom portion of the active pillar;

forming a second source/drain region formed at a top portion of the active pillar; and wherein a width of a widest portion of the outer surface of the ring-shaped gate is equal to or less than that of a widest portion of the outer surface of the ring-shaped insulation spacer.

29. The method of claim 28, further comprising forming a buried bit line below the active pillar in the semiconductor substrate and electrically connected to the first source/drain region.

30. The method of claim 28, further comprising forming a word line extending in a horizontal direction and electrically connected to the round-shaped gate.

31. The method of claim 28, further comprising forming a capacitor electrically connected to the second source/drain region.

32. The method of claim 28, further comprising forming an insulating layer pattern bisecting the first source/drain regions of neighboring unit cells.

33. The method of claim 29, further comprising forming an ion implantation region below the insulating layer pattern.

* * * * *